(12) United States Patent
Babic et al.

(10) Patent No.: US 8,559,775 B2
(45) Date of Patent: Oct. 15, 2013

(54) COLORLESS OPTICAL NETWORK ARCHITECTURE AND NETWORK COMPONENTS

(76) Inventors: Dubravko Ivan Babic, Santa Clara, CA (US); Tin Komljenovic, Zagreb (HR); Zvonimir Sipus, Zagreb (HR)

( * ) Notice: Subject to any disclaimer, the term of this patent is extended or adjusted under 35 U.S.C. 154(b) by 128 days.

(21) Appl. No.: 13/187,358

(22) Filed: Jul. 20, 2011

(65) Prior Publication Data

US 2012/0020616 A1   Jan. 26, 2012

Related U.S. Application Data

(60) Provisional application No. 61/400,020, filed on Jul. 22, 2010.

(51) Int. Cl.
*G02B 6/26* (2006.01)
*G02B 6/34* (2006.01)

(52) U.S. Cl.
USPC .............................................. 385/27; 385/37

(58) Field of Classification Search
USPC ............................................................ 385/27
See application file for complete search history.

(56) References Cited

U.S. PATENT DOCUMENTS

| 5,714,680 A * | 2/1998 | Taylor et al. ...................... 73/37 |
| 5,943,124 A * | 8/1999 | Haigh .......................... 356/73.1 |
| 2006/0159458 A1* | 7/2006 | Kagawa ......................... 398/75 |

* cited by examiner

*Primary Examiner* — Omar Rojas
(74) *Attorney, Agent, or Firm* — Shalini Venkatesh

(57) ABSTRACT

An array reflector comprising a waveguide and a high reflectivity mirror is disclosed. The waveguide has an input end and a reflective end. The high reflectivity mirror is disposed at the reflective end. The array reflector also includes n−1 mirrors arrayed along the length of the waveguide, wherein n is an integer greater than two.

15 Claims, 21 Drawing Sheets

- Gain BW ~60nm
- X-band BW ~32 (40ch @ 0.8nm)
- Gain Peak Tolerance +/-5nm
- Gain Temperature Shift ~ 15nm (0.5nm/C from 40C to 70C)

COLORLESS OPTICAL NETWORK ARCHITECTURE AND NETWORK COMPONENTS

RELATED APPLICATIONS

This application claims benefit of U.S. Provisional Patent Application Ser. No. 61/400,020 filed Jul. 22, 2010

FIELD OF THE INVENTION

The present invention relates to a dense wavelength division multiplexing (dense WDM or DWDM) optical network system, and more particularly to a dense WDM-passive optical network system utilizing an improved self-seeding technique in which output optical signals of different wavelengths are partially fed back by a unique self-seeding element so as to modify the return signal received by a gain medium.

BACKGROUND OF THE INVENTION

Access networks are presently experiencing double-digit growth in the United States, Europe, and a number of Asian countries. Residential and business customers are demanding higher bandwidth from their Internet service providers for multimedia services IPTV, telephony, and high-speed Internet. As a result, many service providers are planning to implement networks capable of delivering 100 Mb/s and higher bandwidths per customer. A number of access network architectures have been developed to address this growth. The cost of implementing any network technology plays a critical role in the decisions related to its adoption and deployment. Passive-optical-networks (PON) feature lowest capital-equipment expenditures relative to point-to-point and active optical networks. In a PON, the remote nodes (RN) between the feeder fibers (FF) connecting to the central office (CO) and the distribution fibers (DF) connecting to different optical network units (ONU) are passive. Examples of such networks are shown in, for example, the book by C. F. Lam, *Passive Optical Networks Principles and Practice*, Academic Press, 2007, and publication by C-H. Lee, W. V. Sorin, and B. Y. Kim, "Fiber to the Home Using a PON Infrastructure", *IEEE J. Lightw. Technol.*, vol. 24, no. 12, pp. 4568-4583, 2006. The use of wavelength division multiplexing in passive optical networks (WDM-PON) is actively investigated as a next-generation optical network architecture meeting the future cost and performance needs due to (a) its point-to-point capability, where it has an advantage over time-division multiplexing passive optical networks (TDM-PON), (b) high-degree of privacy (each user receiving own wavelength), and (c) data rate upgrades available on each channel independently. Most importantly, WDM-PON provides higher bandwidth per user than any other network architecture and hence potentially offers the lowest cost per unit of bandwidth to the user. The key difficulty in such a system has been the cost of the components, particularly arising from the need to transmit light at one wavelength for a specific channel and also receive information at any one of several other wavelengths in the ONU. WDM optical and optoelectronic components traditionally exhibit high cost, among other issues, due to precise wavelength definitions in such systems. One attempt to eliminate the need for wavelength-specific transceivers at the ONU is the introduction of colorless WDM-PON systems.

In a colorless optical network, the wavelengths emitted and received by the transceiver in the ONU are defined in the RN or the CO rather than in the transceiver at the ONU. Such a system can use identical wavelength-nonspecific ONU transmitters, which are significantly less expensive to produce than ONU transmitters in which the wavelengths have to coincide with the DWDM grid specified by the International Telecommunications Union (ITU) organization. A wavelength-non-specific transmitter can be realized as an injection-locked Fabry-Perot laser, in which the injected wavelength is defined by a laser located at the CO, or by seeding a reflective semiconductor optical amplifier (RSOA) at the ONU using a spectrally sliced broadband light source, such as an LED or Erbium-Doped-Fiber-Amplifier (EDFA) based amplified spontaneous emission (ASE) source and an athermal array-waveguide grating (AWG) [4],[6]-[9]. When the same wavelength is used for downstream and upstream communications, the signal is re-modulated in the RSOA. These approaches still suffer from high cost components: the ASE sources and wavelength specific sources for injection-locking. Further reduction in complexity and cost can be realized by removing the need for centralized injection locking or a seeding source, by using a reflector at the remote node to allow the ASE signal emitted from the RSOA to seed itself. The first experimental demonstration of an RSOA self-seeding architecture was shown in the publication by E. Wong, K. L. Lee, T. B. Anderson, "Directly Modulated Self-Seeding Reflective Semiconductor Optical Amplifiers as Colorless Transmitters in Wavelength Division Multiplexed Passive Optical Networks", *IEEE J. Lightw. Technol.*, vol. 25, no. 1, pp. 67-74 (2007). However, in that work, insufficient seeding light power was observed to lead to an undesirably high bit-error floor, while the modulation present in the seeding light reduced the eye opening in the upstream beam.

Therefore, an unmet need for a low-cost high-performance WDM-PON solution exists in the industry. This application discloses a network system architecture and innovative components of that network system that enable cost reduction and performance improvement relative to the existing technology offerings.

SUMMARY OF THE INVENTION

According to one embodiment, there is provided an array reflector comprising a waveguide having an input end and a reflective end. A high reflectivity mirror is disposed at the reflective end. The array also includes n−1 mirrors arrayed along the length of the waveguide, wherein n is an integer greater than two.

DETAILED DESCRIPTION OF THE INVENTION

The present invention has been made in view of the problems discussed in the "Background of the Invention" section above. One object of the invention is to provide a DWDM optical network system that offers lower cost per user and per bandwidth than any previous colorless seeded WDM-PON implementations.

In one embodiment, the preferred colorless optical network system employs wavelength non-specific optical modulation and gain elements in each ONU. Each gain element amplifies and modulates the light of the specific wavelength returned from the remote node ("seeding light"), wherein the remote node reflects the spontaneous emission emitted by the gain elements, removes the modulation in the emitted beam, and selects the wavelength to be returned to the same optical gain elements. The modulation in the light returned to the optical gain elements is removed using an averaging reflector. This results in higher optical link margin, and low cost because the array reflector is passive. Furthermore, any eventual polarization dependence of the gain elements is eliminated by depolarizing the light returned from the remote node to the optical gain elements using a fiber depolarizer.

This invention improves the cost of a traditional DWDM network system by providing an architecture that can be realized using passive components in combination with low-cost optical components. Advantages of this invention are (a) the use of forward-error correction design enables error-free operation, (b) the use of a seed element that decreases (improves) seeding threshold and control requirements, (c) all components in the remote node are passive. Optical network units (ONU) employ standard form factors which provide for small low-power-consuming units in residences, while in the central office they can be used for enterprise, backhaul and MTU/MDU deployments. The wavelengths for operation of the preferred embodiment range from 1260 nm to 1625 nm, covering the entire fiber transmission band. In one embodiment, 40 channels in this spectral range are used.

Network Architecture

FIG. 1 shows an illustration of a colorless DWDM optical network system 100 employing the present inventions. The system comprises a central office or optical terminal 101 generating and receiving optical signals of different wavelengths via a trunk fiber 111. On the other end of the trunk fiber 111 is a remote node 106 that contains a WDM filter with a seed element (not shown in 106, but described below) to couple light between the trunk fiber 111 and any number of distribution fibers 103 that ultimately connect to optical network units (ONU) 104 at its ends. In one embodiment of the invention, each ONU comprises at least one optical gain element and at least one optical receiver, both to be described in more detail below. The electrical communication between the optical network units 104 and the customer is denoted by connection 105 for each network unit. A typical required length for the trunk fiber 111 is over 20 kilometers, while the distribution fiber 103 length requirement is about 1 kilometer. In one embodiment, the equipment in the central office 101 is identical to the equipment in the remote node 106 and the optical network units 104 at the central office 101 may contain components with identical principles of operation: a WDM filter with a seed element and optical network units (not shown in FIG. 1) located within the node 116, optical connection 113 between the node 116 and central-office ONUs 114. In the central office 101, the ONUs 114 may all be co-located and a part of the same enclosure or blade (a term commonly used for enclosures containing one or a group of network processors) and hence can be directly inserted into a data switch 115. The main difference between the optical connections in the field and the central office is the presence of the distribution fibers 103 in the field. In another embodiment, the central-office ONUs 114 comprise fiber-optic transceivers.

FIG. 2 illustrates some envisaged embodiments in more detail, with annotations corresponding to preferred operating conditions: The central office 201, the trunk fiber 211, remote node 206, one shown distribution fiber 203, and ONU 204 respectively correspond to elements 101, 111, 106, 103, and 104 shown in FIG. 1. The trunk fiber 211 preferably carries multiple optical signals from the remote node 206 towards the central office 201 encoded in multiple wavelengths, commonly referred to as upstream wavelengths, denoted with $\lambda_U$, and upstream optical signals. The same trunk fiber 211 also preferably carries optical signals encoded in multiple wavelengths from the central office 201 towards the remote node 206. These wavelengths are referred to as downstream wavelengths, denoted with $\lambda_D$, and downstream optical signals. The ONU 204 comprises an optical-gain element 205, an optical receiver element 224, a beam-splitter 210, a physical-media interface (PHY) 220, and connections to user electrical interface 221. In one embodiment, the ONU includes a forward-error correction circuit 225. The beam splitter separates the upstream optical signals from the downstream optical signals as indicated with the arrows next to the upstream and downstream wavelengths $\lambda_U$ and $\lambda_D$, respectively. Every individual ONU 204 of a multiplicity of ONUs 204 is optically coupled to a remote node 206 using the distribution fiber 203. Only one ONU 204 is shown, but each fiber 208 at the output of the remote unit 206 may have one ONU connected to it. The remote node 206 comprises a WDM filter 216 which separates multiple downstream wavelengths encoded with data from the trunk fiber 211 into separate wavelengths on distribution fibers 207 and 208, and feeds those downstream optical signals to each individual ONU 204. The WDM filter 216 simultaneously combines different upstream optical signals from the ONUs 204 via the distribution fibers 207 and 208 into one fiber 212. The remote unit 206 furthermore comprises a seeding element 213. The seeding element 213 reflects a portion of the upstream optical signal back towards the WDM filter 216, the WDM filter separates individual reflected upstream wavelengths and directs them to seed ONUs 204 associated with those wavelengths. The optical-gain element 205 amplifies and modulates the optical signal of associated wavelength appearing at its input and hence generates a new modulated upstream optical signal. In one embodiment, the principle of signal generation operative within the central office 201 is identical to the described principle of signal generation between the remote node 206 and the ONUs 204 at the end of each of the distribution fibers 208.

The principle of light generation involves broadband spontaneous emission generated and modulated by the optical-gain element 205 which is emitted towards the remote node 206 via the distribution fiber 203. The spontaneous emission is filtered in the WDM filter 216 and only the selected wavelength $\lambda_U$ is passed through to the seeding element 213 via the optical interconnect 212. The seeding element reflects a portion of the incident light back towards the WDM filter 216. The reflected light exhibits substantially reduced optical modulation relative to the incident light, as the seeding element comprises a reflector (described below) that reduces, removes all, or removes substantially all modulation by a process of averaging the bit stream. The reflected optical signal with the reduced modulation (averaged bit stream) is returned via the WDM filter to the corresponding ONU 204, where it is amplified and modulated with a new data stream. A portion of the amplified and modulated light is transmitted through the seeding element 213 and delivered to the trunk fiber 211 for upstream communication.

FIG. 3 illustrates schematically the upstream optical signal path in the transmitter architecture 300 of one embodiment of a colorless optical network system according to the current invention. The optical transmitter comprises an extended cavity, denoted with the parenthesis 330, that originates in the gain element 305 in the ONU 304 and extends through the beam-splitter 310, the distribution fiber 311, the WDM filter 306, the coupler 323, depolarizer 321, and the seeding reflector 322. Optical energy oscillates between the seeding reflector 322 and the back mirror 308 of the optical-gain element 305. The same seeding reflector 322 and depolarizer 321 are used to reflect upstream optical signals coming from all ONUs attached to the distribution terminals 318 on the same WDM filter 306. In one embodiment, the optical-gain element is a reflective semiconductor optical amplifier, also referred to below as an RSOA.

In one embodiment, the light intensity in the extended cavity is modulated by direct modulation of the optical gain in the optical gain element 305. Direct modulation is driven by a modulated current originating from a laser driver amplifier (not shown) as is known in the art. In another embodiment, the gain in the gain medium is altered by modulating a loss element in the gain unit 305. This is made possible by introducing an absorber at the back of the laser cavity. In yet another embodiment, the modulation of the gain is accomplished by modulating the value of the reflectivity of the back reflector 308. In yet another embodiment, the optical signal is modulated by using a gain element and an external modulator.

The data stream used to modulate the gain in the extended cavity is provided by a physical layer electronic (PHY) circuitry 220 which in turn receives its input from the outside world via electrical lines 221. In one embodiment, the PHY comprises a laser driver function, receiver function, clock-and-data recovery function, optionally serializing and de-serializing functions and all of these functionalities are integrated into one chip. In another embodiment, the data going into (and out of) the physical layer circuitry 220 is encoded (and decoded) with a forward-error correcting (FEC) algorithm in the functional block 225, and this FEC functionality is integrated into the same chip containing the PHY. Transmission of data encoded with FEC algorithms enables significant improvement in the detection of data from noisy and distorted signals relative to those without FEC coding. The improvements can be several dB, meaning that when data are encoded with an FEC, the input power into the receiver on the other end of the link can be several dB lower than it would have to be if no FEC was used to obtain the same bit-error rate. This adds several dB to the link budget and is crucial in making these links practical.

In one embodiment, the gain in the optical-gain element 205 (in FIG. 2) or 305 (in FIG. 3) is realized in the form of a semiconductor-optical amplifier (SOA). The gain in semiconductors has a limited bandwidth, which may be too small at a given temperature to satisfy the typical gain of a colorless optical networking system. The peak gain is sensitive to temperature and moves towards longer wavelength as the temperature increases. In one embodiment of the present invention, the gain element is heated to allow the peak of the semiconductor gain to move towards longer wavelengths and thereby allow for wider bandwidth as illustrated in FIG. 12 and discussed below.

FIG. 4 illustrates schematically the downstream optical signal path in an exemplary receiving architecture 400. The downward propagating signal 403 from the CO uses wavelength $\lambda_D$, which is different from $\lambda_U$. The signal traveling from the CO enters the remote node 404 and may pass through the coupler 423 (not shown) or be rerouted around the coupler 423 as shown with arrows 403 on its way to the WDM filter 406, and the distribution fiber 411 leading to the ONU 405 associated with the specific downstream wavelength $\lambda_D$. At ONU 405, the signal gets separated at the beam-splitter 410 to be detected at the optical receiver 425. The optical receiver comprises a photodetector (not shown) and transimpedance amplifier (not shown) as is well known in the art.

FIG. 5 illustrates an example of the wavelength spectrum that may be used by one embodiment of an optical network system in accordance with the current invention. An exemplary spectrum 501 illustrates all available wavelengths for communication using the colorless network system 100. The spectrum comprises groups of channels separated by the free-spectral range of the WDM filter 216; two groups are indicated with 510 and 520. Within each group, the wavelengths are substantially equidistant and separate by a wavelength difference referred to as the channel spacing. The wavelengths and channel spacing are defined by the International Telecommunications Union (ITU). The spacings may, for example, be 200 GHz, 100 GHz, or, more recently, 50 GHz. In one embodiment, the upstream wavelengths uploading direction (from the ONU towards the central office) may use, for example, band 521, while the downloading direction (from the central office towards the optical network unit) may, for example, use band 511.

Principle of Operation

FIG. 6 illustrates an architecture and model 600 for upstream optical signal generation and modulation in a preferred optical link. The broadband ASE signal emitted from each optical-gain element (denoted with RSOA) is spectrally sliced by an AWG in the RN and fed back via a passive reflective path to seed itself without requiring centralized broadband source. In one embodiment, a bandpass filter (BPF) with a passband comparable to the free spectral range of the AWG is used to select only one spectral slice of light per output port and reflect it back to seed each RSOA. In one embodiment, the AWG is athermal, not needing active temperature tracking between components placed at RN, ONU and CO. Identical RSOA components can be used at all ONUs, since the wavelength is determined by characteristics of the AWG and the BPF. The RSOA is seeded via light reflected from an array reflector. The depolarizer is used to eliminate the polarization dependence of the RSOA.

In order to improve the margin of the system, embodiments of the optical architecture use the seeding reflector to reduce the fluctuation of the seeding light. This reduction involves averaging the power in the bit stream, i.e. redistributing the power of each bit to many adjacent bits. The coupler is used to divide energy between the OLT (CO) and the array reflector and can be used to optimize the design depending on the minimum energy needed to seed the RSOA, the sensitivity of the receiver at the OLT (CO), and the lengths of feeder and distribution fibers.

In order to illustrate the advantage of an optical link in accordance with the claimed invention, we consider a simplified optical link consisting of a RSOA with saturable gain characteristic where the gain is modulated between two values $G_L$ and $G_H$, an optical fiber (with couplers, depolarizer, etc.) characterized by a loss $\alpha<1$ and a delay $\tau_\alpha$, and a reflector that is either a hard reflector or an averaging (array) reflector. We will first assume that random-sequence square-wave modulation incident on the array reflector is returned as a normally-distributed amplitude fluctuation with variance given by $\gamma^2 A^2$, where A is the peak-to-peak amplitude of the incident optical signal modulation and $\gamma$ is the standard deviation of that fluctuation. In the probability distribution function (PDF) analysis section below, we will show under which conditions the reflected wave is indeed normally distributed. The RSOA gain G and saturation power $P_S$ are approximately described with the lumped amplifier relationship: $P_{OUT} = GP_{IN}/(1+P_{IN}/P_S)$ where $P_{in}$ and $P_{out}$ are the input and output powers respectively. In this relationship, the output power is bound, meaning that $P_{OUT} \leq GP_S$ holds at all times, a case commonly referred to as "hard saturation".

We have also investigated soft saturation (a case in which the output power is unbound) using the implicit gain relationship for distributed optical amplifiers described in N. K. Dutta and Q. Wang, *Semiconductor Optical Amplifiers*, World Scientific Publishing, 2006. We found that the latter approach yields results that favor the array reflector significantly more than the hard reflector, as a result of the unbound output power. However, this may be unrealistic. We therefore use the hard saturation approach (with bound output power) in order to make a worst-case comparison. For simplicity we assume that the saturation power $P_S$ (referring to the input power) does not depend on either the input power or on the RSOA drive current. This assumption does not alter the physics in our analysis, but it significantly simplifies the math. The delay $\tau_\alpha$ can be in the tens of micro-seconds (corresponding to a 2 km round trip) and is significantly larger than any bit-to-bit correlations. Hence $\tau_\alpha$ did not enter our analysis.

The optical power oscillation in this extended cavity (assuming no applied modulation) is established by a gradual process: spontaneous emission generated in the RSOA travels around the link to be amplified repeatedly and finally converges to a steady state value. For this process to converge to an output power above zero, the gain should be at least $G_H$ where $\alpha G_H > 1$, but to achieve stable operation in both bits, one also requires gain $G_L$ where $\alpha G_L > 1$. The final value of the output power is determined by repetitive application of the saturation equation. The convergence and the steady state of this process follow the iteration method described in general numerical analysis texts. When modulation is present, the amplifier is either in a high state or a low state and the signal tends to become confined within two amplitude ranges, as shown in FIG. 7; the low bit range between $P_1$ and $P_2$, and the high bit range between $P_3$ and $P_4$. The values of the (input-equivalent) bounds $P_i$ can be determined by inspection to be $$P_3 = P_S G_H(\alpha - 1/G_L) P_4 = P_S G_H(\alpha - 1/G_H)$$

$$P_1 = P_S G_L(\alpha - 1/G_L) P_2 = P_S G_L(\alpha - 1/G_H) \quad (1)$$

The average powers during the high and the low bits are determined by averaging the saturation characteristic between $P_1$ and $P_4$ and they can be expressed using the parameter $\beta$ defined below. The high and low bit input-equivalent average powers are given by $$\overline{P}_L = \alpha G_L P_S \beta \quad (2)$$

$$\overline{P}_H = \alpha G_H P_S \beta$$

$$\beta = \frac{P_S}{P_4 - P_1} \int_{P_1/P_S}^{P_4/P_S} \frac{x\,dx}{1+x} = 1 - \frac{1}{\alpha(G_H - G_L)} \ln\left(\frac{G_H}{G_L}\right)$$

For the purposes of comparison between the hard reflector and the array reflector, we only study the steady state amplitude locus and leave the starting conditions and noise for future work. To compare the two reflectors we monitor the optical signal-to-noise ratio:

$$SNR_{HR} = \frac{P_3 - P_2}{\sigma_H(0) + \sigma_L(0)} \quad (3)$$

$$SNR_{AR} = \frac{\overline{P}_H - \overline{P}_L}{\sigma_L(\gamma) + \sigma_H(\gamma)}$$

Here $P_3 - P_2$ is the eye opening, and $\sigma_L^2$ and $\sigma_H^2$ are the variances of the amplified signal on the high and low bits reduced to the amplifier input. For the array reflector, the variance of the amplified spontaneous emission is increased by the normally distributed fluctuation from the converted RSOA modulation. This added variance is proportional to $\gamma^2$, hence $\sigma_H(\gamma)$ and $\sigma_L(\gamma)$ depend on $\gamma$. The noise terms that apply to both hard and array reflectors are shown below.

$$\sigma_H^2(\gamma) = \sigma_{SPH}^2 + (\sigma_L^2 + \gamma^2(P_4 - P_1)^2)\alpha^2 G_H^2 D^2(\alpha G_H \beta)$$

$$\sigma_L^2(\gamma) = \sigma_{SPL}^2 + (\sigma_H^2 + \gamma^2(P_4 - P_1)^2)\alpha^2 G_L^2 D^2(\alpha G_L \beta) \quad (4)$$

$$D(x) = 1/(1+x)^2$$

Here $\sigma_{SPH}$ and $\sigma_{SPL}$ characterize spontaneous emission from the amplifier $\overline{P}_H$ and $\overline{P}_L$ (referred to the amplifier input). They are related through the SNR given for unpolarized thermal light: $\sigma_{SPL}\sqrt{2M} = \overline{P}_L$ and $\sigma_{SPH}\sqrt{2M} = \overline{P}_H$, where M is the number of degrees of freedom and is proportional to the ratio of the optical bandwidth $BW_o$ to the electrical bandwidth $BW_e$ of the system: $M \equiv BW_o/BW_e$ [15]. Shot-noise has been neglected for simplicity. The amplified noise is treated as a small fluctuation on top of the signal and hence the amplification of the noise is proportional to the derivative of the gain characteristic. This is the reason for the fourth power in the denominators of (4). Once all the terms are introduced, the expressions for noise on the high and low bit become:

$$\sigma_H^2 = P_S^2 \frac{\frac{(\alpha G_H \beta)^2}{2M}(1 + A_{LH}) + \gamma^2 \alpha^2(G_H - G_L)^2 A_{HH}(1 + A_{LL})}{1 - A_{LL}A_{HH}} \quad (5)$$

$$\sigma_L^2 = P_S^2 \frac{\frac{(\alpha G_L \beta)^2}{2M}(1 + A_{HL}) + \gamma^2 \alpha^2(G_H - G_L)^2 A_{LL}(1 + A_{HH})}{1 - A_{LL}A_{HH}}$$

$$A_{XY} = \alpha^2 G_X^2 D^2(\alpha G_Y \beta)$$

We introduce nominal gain as $\overline{G} \equiv G_L G_H/(G_L + G_H)$ and extinction ratio as $\epsilon = G_H/G_L$. The nominal gain $\overline{G}$ is the lowest gain for which the eye opening $P_3 - P_2 \propto (\alpha \overline{G} - 1)$ is greater than zero.

We now plot the functional dependence of the SNRs for the two reflectors as a function of average loop gain $\alpha \overline{G}$. FIG. 8 shows the comparison between the resulting SNR values (3) for several extinction ratio values using a typical value of AWG bandwidth of $BW_o = 0.4$ nm, and line rate of 1 Gbps, where the electrical bandwidth is selected to correspond to 75% of the line rate: $BW_e = 0.75$ GHz. In this simple model, the signal-to-noise ratio is determined by the ratio of the optical-to-electrical bandwidths (M), and, therefore, the bit-error rate may experience an error floor if M should become small. In the limit when the RSOA is in deep saturation, all fluctuations are compressed and the curves merge (high $\alpha \overline{G}$). The SNR for hard reflector drops to zero at $\alpha \overline{G} = 1$ because the eye opening vanishes. The eye opening in the array reflector case is larger for any value of $\alpha \overline{G}$: the eye opening for the hard reflector case divided by the eye opening for the array reflector case is approximately proportional to $1 - 1/\alpha \overline{G}$. The curves showing the array reflector results are not shown for $\alpha G_L \leq 0$. The key observation evident from FIG. 8 is that an averaging reflector can dramatically improve the link margin and allow a wider range of RSOA operating conditions without sacrificing performance.

The modulation in the light beam emitted by the gain elements in FIG. 6 is eliminated from the optical beam using a reflector that averages the energy among the bits in the bit stream. In one embodiment, the seeding reflector averages the optical power fluctuations and converts their amplitude PDF to an approximately normal distribution: the seeding reflector is a modulation averaging reflector. This in turn replaces the bound fluctuations in the gain-element amplified signal with additional Gaussian noise whose variance can be tailored with the array reflector design. Inasmuch as variances rather than amplitudes of the amplified spontaneous-emission and modulation with Gaussian PDF add, this approach results in a wider eye opening at the receiver and improved signal-to-noise ratio (SNR) of the self-seeded optical source relative to the hard reflector architecture.

In one embodiment, the seeding reflector comprises an array of mirrors embedded in a segment of an optical fiber, i.e., the mirrors are in-fiber mirrors. Such a reflector is referred to as an array reflector. FIG. 9 shows an embodiment of the array reflector 900 with N mirrors (903 to 907). The optical beam enters the fiber 904 in the direction shown by the arrow 906 and experiences the first reflection on the mirror 903, but some of the power passes through to the other mirrors and ultimately some fraction of that power reaches the last mirror 907. At the last mirror 907, it is beneficial if the majority of the incident light gets reflected. In one embodiment, the delay time 909 between the individual reflectors is constant. In another embodiment, the round trip time depends on the ordinal number of the reflector counted from mirror 903. In this latter embodiment, the time delays between adjacent in-fiber mirror are adjusted to produce an array reflector with best modulation reduction at a given bit rate range for the lowest number of in-fiber mirrors N. In one embodiment, the individual in-fiber mirror reflectivities monotonically increase with the ordinal number of the mirror starting from the first mirror 903 and ending with the last mirror 907, which has highest reflectivity. In one embodiment, the in-fiber mirror reflectivities are adjusted in such a way that the array reflector produces best modulation reduction at a given bit rate or bit rate range for the lowest number of in-fiber mirrors N. In one embodiment, N−1 in-fiber reflectors all have substantially equal optical reflectivity, while the last, Nth reflector has high reflectivity approaching 100%, or at least 90%.

FIG. 10 shows an embodiment of the array reflector 1000 which includes N reflectors and utilizes an optical splitter 1001. The optical beam enters the array reflector via the optical fiber 1005 in the direction illustrated with the arrow 1004. The optical beam gets split at the optical splitter 1001 and thereby launches two optical waves in the fiber loop 1003: the two directions of the launched beam are indicated with the arrows 1007 and 1006. The embodiments involving particular choices of either the delay time 1009 between individual reflectors 1002 or the individual in-fiber mirror reflectivites as described above for array reflector 900 also apply to array reflector 1000. In one embodiment, the splitting ratio of the optical splitter is 50%. In yet another embodiment, the splitting ratio is a design parameter adjusted to achieve a specific frequency response of the array reflector.

Another embodiment of an array reflector 1100 in accordance with the current invention is illustrated in FIG. 11. An electromagnetic wave is incident in the direction 1106 upon a waveguide 1107. In one embodiment, the waveguide 1107 is a segment of an optical fiber, while in another embodiment the waveguide 1107 is realized as a waveguide on top of a substrate. In this embodiment, the multiple reflections needed for filtering the bit pattern described above are realized using any number of discrete ring-resonators 1104, 1105, and 1108 that are positioned in the immediate neighborhood of the waveguide 1107 in such a way that a fraction of the electromagnetic energy traveling down the waveguide 1107 is coupled to each individual ring-resonator (1104, 1105, 1108, etc) and then the energy stored in each resonator (1104, 1105, and 1108) is coupled back to the waveguide 1107. The embodiments involving particular choices of the delay between adjacent ring-oscillators 1103 or the reflection realized with each oscillator, as described above for array reflector 900 apply to this embodiment (1100).

Array Reflector

The purpose of the array reflector is to reduce (minimize) the modulation in an incoming optical beam while reflecting substantially all of the power, i.e. keeping the reflection coefficient close to unity. The redistribution of the optical energy in time is equivalent to extreme inter-symbol interference. There is more than one way to spread the bit energy while maintaining the total signal optical energy. Examples include a high-Q resonant optical filter, a fiber with high chromatic dispersion, or a dispersive grating system. However, all of the mentioned approaches are strongly wavelength dependent. In order to make this component attractive for PON systems in terms of cost (and simplicity), it has to be capable of serving many channels simultaneously: seeding reflector bandwidths greater than ten nanometers or more would be particularly useful. Furthermore, the reflector should be passive and require no adjustments to adapt to various line-rates.

One beneficial implementation of the array reflector of the current invention is a reflecting filter rather than a transmission filter, as the reflector is intended to be one "side" of a long (distribution) fiber cavity. The reflector has to feature near-unity power reflection coefficient, as it cannot be used in transmission of data: the transmitted data is destroyed by averaging. For the purposes of analysis, we first show the case when the time separation between the mirrors is $\tau/2$. This periodicity defines the design line-rate $B_\tau=1/\tau$. The fundamental assumption underlying the reflection filter design shown in FIG. 13 is that the light modulated in the cavity and emitted from the RSOA has coherence time shorter than or much shorter than the round-trip time separation between the mirrors, i.e. $\tau_{coh} < \tau$ or $\tau_{coh} \ll \tau$.

We define coherence time as the time interval for which the autocorrelation function $R(\tau)$ of the electric field reduces to ½ of its peak value. For optical signals with amplified spontaneous emission noise, the auto-correlation function is at a maximum at $\tau=0$ and decreases with $|\tau|$. Coherence length is defined as the product of coherence time and group-velocity of optical signal: $L_{coh}=v_g \tau_{coh}$. The Fourier transform of an optical-signal auto-correlation function $R(\tau)$ is the power-spectral-density (PSD) $\Omega(\omega)$, where $\omega$ is the optical wave oscillating frequency. The PSD $\Omega(\omega)$ decreases around the center oscillation frequency. It is common in the optics industry to express PSD and other spectra-related quantities in terms of wavelength rather than frequency, the conversion between the two being well known in the art. The linewidth of an optical signal is commonly expressed in terms of wavelength spread defined as the difference in wavelengths at which the PSD value reduces to ½ its value at the maximum; i.e. in terms of the full-width at half maximum (FWHM). Clearly, the relationship between the coherence time or length and the linewidth is deterministically defined via the Fourier transform between the auto-correlation and the power spectral density, as is well known in the art. In other words, knowing the power spectral density of an optical signal allows one to unambiguously determine the coherence time, coherence length, and the FWHM. The coherence time of a light beam filtered by a Gaussian-shaped AWG with FWHM $(\Delta\lambda)$ =0.05 nm at wavelength $\lambda=1550$ nm is given by $$\tau_{coh} = \frac{2\ln 2}{\pi}\left(\frac{\lambda^2}{c\Delta\lambda}\right) \approx 70 \text{ ps} \qquad (6)$$

(where c is the speed of light in vacuum)

It is well known in the art that the group velocity of an optical signal is given by the velocity of light in vacuum divided by the group-refractive index of the medium or waveguide in which the optical signal travels. Clearly, the design line rate $B_\tau=1$ Gbps is well above this limit. For larger optical bandwidths, the coherence length will be even shorter.

The transmission through the passband of a WDM filter takes a shape that is determined by the filter design. The power-spectral density, commonly referred to as the optical spectrum, of the transmitted signal has a coherence time, coherence length, and linewidth that are each determined by the shape of the WDM filter.

In order to explain the operation of the array reflector, consider first a reflector with a finite impulse response (FIR) comprising n impulses of equal magnitude $h(t)=(1/n)\cdot\delta(t-mT)$, where T is the bit duration and m is an integer running from 0 to n−1. The integral of the impulse response is unity. If a random bit stream x(i) with amplitudes 0 and A is incident on such a filter, the output of the filter s(i) will be a random variable distributed with a binomial distribution P(k,n), where k is the number of ones in n bits. The expected value and the variance of s(i) can be obtained analytically to be $\bar{y}=A/2$ and $\mathrm{var}(y)=A^2/4n$, respectively. From $\mathrm{var}(y)=\gamma^2 A^2$ we obtain $\gamma=\frac{1}{2}\sqrt{n}$, showing that the averaging improves with increased number of layers and that γ can be made arbitrarily small.

FIR reflectors cannot be realized passively. The impulse response of a realistic reflector shown in FIG. 13 is infinite (IIR reflector). The reflector of FIG. 13 can be built in an optical fiber where all the semi-transparent reflectors are made either as fiber Bragg gratings (FBG) or individual in-mirrors, for example. The last mirror can be realized by coating the fiber end with a high-reflectivity (HR) interference coating.

The parameter space for the optimization of the reflector comprises (a) the reflectivity of each mirror $r_i$, (b) the number of mirrors n, and (c) the distance between the mirrors $\tau_i/2$. In this work, we focus on (a) and (b) and leave mirror separation (c) for future work. We calculate the amplitude PDF of the signal returning from the reflector when a random bit sequence is incident. We are particularly interested to determine the circumstances under which the PDF of reflected wave will approach a Gaussian distribution. We track the variance $\gamma^2$ of the returning signal. The incident bit sequence has no inter-symbol interference and takes only two discrete values: zero and one. We perform the analysis in discrete time, at the center of the bits only. An ideal array reflector (FIG. 13) has a bound non-negative impulse response h(k) with no energy loss.

$$\sum_{k=0}^{\infty} h(k) = 1 \tag{7}$$

$$h_m = \max[h(k)]$$

$$h_m < 1$$

An array reflector has n mirrors of which the last mirror is always a unity mirror. In practice the last mirror may have reflectivity lower than unity without departing from the spirit of the invention, but any reflectivity significantly lower than unity degrades the averaging performance of the array reflector. For this reason, it is preferred that the reflectivity of the last mirror be maximized, or at least have optical power reflectivity of at least 90%. For analysis purposes (in the model described below), we maintain unity reflectivity. The essential feature of the array reflector is that its impulse response is distributed (non-zero) over the interval between one and at least n, and for this reason $h_m$ reduces with increasing n.

The incident bit stream x(k) comprises independent bits taking the value zero or one with equal probability, and the output s(k) from the reflector is given by the convolution shown in equation (8). Inasmuch as the bits are random and independent of each other, no generality is lost by exchanging any of the bits in time to replace the convolution with a sum of h(k)x(k) products (this change is indicated with the arrow in equation (8)):

$$s(k) = \sum_{i=0}^{\infty} h(i)x(k-i) \rightarrow \sum_{k=0}^{\infty} h(k)x(k) \tag{8}$$

The reflector output s(k) is a sum of individual random variables h(k)x(k). The amplitude PDF $f_k$ of h(k)x(k) is given by a two-delta-function PDF in which the separation between the end points is determined by the impulse response at k.

$$f_k(x) = \frac{1}{2}\delta\left(x+\frac{h(k)}{2}\right) + \frac{1}{2}\delta\left(x-\frac{h(k)}{2}\right) \tag{9}$$

The variance of s(k) is written directly applying the variance summation rule [16]:

$$\gamma^2 = \sum_{k=1}^{\infty} \left(\frac{h(k)}{2}\right)^2 \tag{10}$$

Note that all odd moments are equal to zero due to the symmetry of the PDF around zero. The goal of the analysis is to minimize (10).

In the analysis procedure, we first define analytic approaches to fitting the desired impulse response, and then we search for optimal reflectivity distribution numerically by using a global optimization algorithm called PSO (Particle Swarm Optimization) [17], [18], written in Matlab®. To check the results of the PSO algorithm, we determine the impulse response of any reflector design using a Monte Carlo simulation as well as using PSO.

The light propagation is modeled in the time-domain. The forward and backward propagating energies (forward is the direction moving toward the mirror with unit reflectivity) are denoted with $a_{i,x}$ and $b_{i,x}$, respectively. In each time step the energy propagates into neighboring cells taking into account transmitted and reflected components of light power.

$$a_{i+1,x} = a_{i,(x-1)} \cdot t_x + b_{i,x} \cdot r_x$$

$$b_{i+1,x} = b_{i,(x+1)} \cdot t_{x+1} + a_{i,x} \cdot r_{x+1} \tag{11}$$

Here x denotes the cell (inside the cell $a_{i,x}$ and $b_{i,x}$ represent forward and backward propagating wave) or the boundary ($r_x$, $t_x$). The $r_x$ is the reflection coefficient at the boundary between cells x−1 and x, while $t_x$ is the transmission coefficient between same cells. The reflector is spatially discretized. At any point in the structure, we can define a reflecting surface or a fully transmitting interface (unity transmitivity) for just transmission (no reflector). The test signal is a pseudo-random bit sequence (PRBS) with $2^{16}$ bit period.

The Monte Carlo method is implemented as a photon-counting experiment in which discrete photons are incident on the array reflector and at each mirror in the reflector a random number is drawn and compared to the reflectivity value at the specific mirror to determine whether a reflection or transmission will occur. We track the delay time each photon accumulates before it exits the reflector to generate the impulse response. The precision to which the reflectivity is defined can be set arbitrarily, but we used at most four significant digits. The typical number of photons used is $10^8$.

A. Progressive Reflectivity Array Reflector (PAR)

Consider an array reflector shown in FIG. 13 operating at a center line rate in which the reflectivities of the semi-transparent mirrors can be adjusted to produce an optimal response with the smallest variance γ for a given number of mirrors n. We refer to the variance y as the Figure-Of-Merit for this problem, with the objective being to minimize it.

From our FIR analysis (Section III.A), it is clear that variance (10) will be minimized when all the impulses are equal (leading to binomial distribution). We extend this and construct a reflector that features an IIR that is uniform for n pulses and then decays monotonically after that (while still maintaining unity integral). We will refer to this reflector as the progressive reflectivity array reflector (PAR). Starting from the last (unity reflectivity) mirror, it is possible to determine the values of individual mirror reflectivities by requiring that the first n pulses in the impulse response are of equal amplitude. The mirror reflectivity values $r_i$ that satisfy these requirements can be found analytically, albeit using numerical root finding algorithms, since a stack of m mirrors leads to an m-th order polynomial. We only determined the exact values up to 4 mirrors, and the results are shown in Table I.

TABLE I

OPTIMAL MIRROR REFLECTIVITIES FOR PAR WITH n ≤ 4

| n | $r_1$ | $r_2$ | $r_3$ | $r_4$ |
|---|---|---|---|---|
| 1 | 1 | | | |
| 2 | 0.381966 | 1 | | |
| 3 | 0.233972 | 0.398727 | 1 | |
| 4 | 0.168361 | 0.243429 | 0.407848 | 1 |

We use this algorithm to formulate an approximate recursive relationship for this type of reflector. We use two adjacent layers starting from the last (end) mirror and consider only reflections that have round trip delay zero and τ, while ignoring higher order (multiple τ) round-trips. We require that the power reflected from the first layer interface (time=0) is equal to the power reflected from the subsequent layer interface (time=τ). The second beam has been transmitted through the first layer interface twice and reflected once from the second layer interface. This approach quickly gives a recursive expression:

$$r_{i-1} = t_{i-1}^2 \cdot r_i \quad (12)$$

We calculate the reflectivities of all the mirrors in the reflector starting from the end by repeat application of (12). FIG. 14 shows the resulting mirror-reflectivity distribution for a 31-mirror reflector. We now employ the PSO algorithm to determine the optimal distribution with minimal γ for a range of n values. For n values between 1 and 4, we arrive at reflectivity numbers that are within 0.1% of the values shown in Table I, confirming the presented approach. We then perform the analysis for 31 layers, n=31. The comparison between analytically determined mirror-reflectivity distribution using recursive relationship (12) and the numerically optimized (using PSO) mirror-reflectivity distribution for the same 31-layer reflector is shown in FIG. 14. The disparity between the obtained reflectivity values is attributed to neglection of the multiple reflections in the (12). Nevertheless, the error is about 20% in the worst case. The impulse responses of reflectors calculated using PSO and analytically are compared in FIG. 15.

The optimal PAR reflector variance is shown in FIG. 16 where it is compared to the FIR result described in the Array Reflector section above, and the uniform array reflector (UAR) analysis discussed in Section B. In summary, the agreement between analytically calculated values (Table I) and PSO optimized reflectivites, and the general shape of the impulse response determined by PSO in FIG. 15 confirm our starting assumption that the impulse response of the optimal averaging reflector will have n equal-intensity impulses followed by a decay. Hence, a PAR defined as above is an optimal array reflector, exhibiting a minimum variance and consequently optimal Figure-Of-Merit for a given number of mirrors.

B. Uniform Reflectivity Array Reflector (UAR)

Consider an array reflector shown in FIG. 13 operating at center line-rate $B_τ$ in which all semi-transparent mirrors (except the last one) have reflectivity r. The impulse response of the UAR is distinctly different from the PAR in that the last (unity) mirror produces a strong and isolated reflection in a sequence of weak reflections from the other uniform mirrors—see FIG. 17. We use this phenomenon to approximately determine the UAR optimal mirror reflectivity r. The UAR impulse response is approximated with two impulses (separated by n−1 bit periods). For minimum variance, both pulses have to have the same magnitude, leading to:

$$r = t^{2(n-1)} = (1-r)^{2(n-1)} \quad (13)$$

We use PSO optimization to fix the number of mirrors n and search for the optimal value of reflectivity r. The results are shown in FIG. 18. As a fitness function in PSO we have used the standard deviation (figure of merit γ) of the output from the reflector for three different input PRBS. The comparison of the impulse responses for the 31-layer UAR case is shown in FIG. 17; the two dominant reflections occur at the beginning and at the unity reflector.

Finally, in FIG. 16 we compare the standard deviation of the output signal vs. number of layers for the studied reflectors: PAR, UAR, and the hypothetical FIR reflector that leads to the binomial distribution. The standard deviation of the input signal is equal to 0.5. Interestingly, there is little difference between UAR and PAR results, and although PAR is somewhat better (lower γ) this can be compensated for by increasing the number of mirrors in the UAR. Additionally, it is clear that IIR reflectors (UAR and PAR) with n mirrors significantly outperform the hypothetical (binomial) FIR reflector.

C. Losses and Variable Bit-Rate

When the array reflector is realized using an optical fiber, the individual mirrors are often referred to as in-fiber mirrors. Optical losses in the fiber array reflector come from fiber material loss and mirror imperfections. For a 1 Gbps line rate, the fiber segments are approximately 10 cm long, and even if one uses 1000 in-fiber mirrors, the total length of the fiber will be well below 1 km. For this distance, with state-of-the-art single-mode optical fibers (loss <0.5 dB/km), total fiber loss will be negligibly small (<0.05 dB). Losses due to mirror imperfections, however, can be large depending on the mirror design, and will reduce both the reflectivity and the transmittivity. We determine the sensitivity of the variance (γ) for several mirror absorptance levels by modeling reduced reflectivity r and transmittivity t proportionally depending on the mirror absorptance a:

$$t' + r' + a = 1$$

$$r' = (1-a)r$$

$$t' = (1-a)t \quad (14)$$

Here t' and r' are the mirror transmittivity and reflectivity in the presence of loss. FIG. 19 shows the effect of loss on γ of the UAR for absorptance a between zero and 2%. The absorptance (a) is related to the excess loss (α) per mirror by the equation α=10 log$_{10}$(a). In FIG. 19, addition of mirror loss is seen to result in a lower bound in γ. In one embodiment of the current invention, where γ is kept below 0.1, the absorptance per mirror (a) is maintained below 1% (α<−20 dB). In yet another embodiment, needed to provide γ below 0.05, the absorptance per mirror (a) has to be below 0.1% per mirror (α<−30 dB). It should be noted that large losses in the reflector add to the link attenuation and hurt the overall link budget. This may have to be compensated for in part by using a coupler with a different splitting ratio in FIG. 6 at the RN depending on the distances between the ONT and OLT (CO). FIG. 19 shows only UAR results as the effect was very similar for the PAR case calculated for the same number of layers.

The basic design of the array reflector assumes that mirror separation is constant (and equals τ/2). Due to the periodic nature of the reflector, its reflection properties (γ) remain unchanged for line rates that are integer multiples of the design line rate. We have found that detuning in the range 1<B/B$_τ$<2 produces a weak increase in γ. A more detailed study of the detuning effects and chirped reflectors (variable distance between mirrors) has been left for future work. In the case where the line rate is lower than the center line rate (B/B$_τ$<1), the reflector will, to first order, appear to have a lower number of mirrors than it does at the design line rate, and the performance should be correspondingly degraded. However, the reflector can always be designed to the lowest expected line rate with little or no penalty to higher line rate performance. Furthermore, it should be noted that the line rates are only expected to increase in practice.

Averaging characteristics of the array reflector are at most weakly dependent on the distance between the reflectors. If the coherence length of the seeding light becomes comparable to the mirror separation (for example, by way of reducing the optical bandwidth), it would be sufficient to increase the mirror separation by an integer multiple to ensure that the separation is much larger that the coherence length.

D. PDF Analysis

The effectiveness of the array reflector in removing the modulation from the signal rests on the assumption that the amplitude probability distribution of any bit sequence at the output of the reflector will be approximately normally distributed. In the Array Reflector section above, we showed that the PDF of the reflected bit stream can be determined as the sum of an infinite sequence of random variables determined by the impulse response as given by equation (8). The Central Limit Theorem states that the PDF of a sum of identically distributed random variables tends to normal distribution as the number of variables grows to infinity. In our case, the distribution of each variable is different, as implied by equation (9). The Central Limit Theorem holds for random variables with different individual distributions, provided they satisfy one or more additional conditions [20]. Here we take a slightly different (and simpler) approach: We show that the reflected bit stream will have an approximately normal amplitude probability density function if the amplitude variance γ can be made arbitrarily small by increasing the number of mirrors n. To this end, we form the moment generating function (MGF) for the individual summands $M_k(\lambda)$ and the reflector output $M_S(\lambda)$. From equation (9) we have:

$$M_k(\lambda) = \cosh\left(\frac{h(k)\lambda}{2}\right) \tag{15}$$

$$M_S(\lambda) = \prod_{k=1}^{\infty} \cosh\left(\frac{h(k)\lambda}{2}\right)$$

We assume that the amplitude of the impulse response will be small for large n (a condition to be determined later). We take the logarithm of (15) and take the first term of the Taylor expansion of the natural logarithm and the cosh around zero. This gives:

$$\ln M_S(\lambda) = \tag{16}$$

$$\sum_{k=1}^{\infty} \ln\left[\cosh\left(\frac{h(k)}{2}\lambda\right)\right] \approx \frac{\lambda^2}{2}\sum_{k=1}^{\infty}\left(\frac{h(k)}{2}\right)^2 - \frac{\lambda^4}{12}\sum_{k=1}^{\infty}\left(\frac{h(k)}{2}\right)^4 + \ldots$$

The higher order terms monotonically decay in magnitude since for non-negative and normalized h(k), and m>0:

$$1 > \left(\sum_{k=1}^{\infty}\left(\frac{h(k)}{2}\right)^2\right)^m \geq \sum_{k=1}^{\infty}\left(\frac{h(k)}{2}\right)^{2m} \tag{17}$$

Based on inequality (17), the variance term in (16), i.e., the $\lambda^2$ term, dominates over all other terms. If the variance could be made arbitrarily small and much less than unity by, for example, increasing the number of mirrors n, the PDF of the sum would clearly converge to a normal distribution. This is seen from the only remaining term being proportional to $\lambda^2$, namely, ln $M_S \propto \lambda^2$.

We now derive a conservative design constraint which ensures that the reflected beam amplitude PDF will tend to a normal distribution. To this end we replace the h(k) distribution of an n-mirror reflector with a uniform distribution of height h$_m$ and length n$_m$ (note that h$_m$n$_m$=1). To place an upper bound on h$_m$, we note that there are distributions in which n>n$_m$ (the PAR design for example). We now find the upper bound to the variance (10) by inserting h$_m$ in place of h(k) in (10) and execute the sum. This gives the condition nh$_m^2$>4γ$^2$. From here it is clear that if h$_m$ tends to zero with increasing n faster than 1/√n, the variance will certainly tend to zero with increasing n and the reflector response will tend to a normal distribution. This trend is satisfied in our PAR and UAR designs. The flat portion of the PAR impulse shows h$_m$<1/n. For the UAR, we need to determine the functional relationship that expresses the upper bound on the isolated reflection in FIG. 17, this being the only point we need to consider, with an amplitude of approximately r, occurring at n. FIG. 18 shows the dependence of r on n and one may easily show that the entire optimal r curve from FIG. 18 tends to zero faster than 1/√n.

Depolarizer

In one embodiment, the optical-gain element is polarization sensitive, namely, the gain of the element for an optical wave with the electric field parallel to an arbitrarily selected x-axis may be very different from the gain for a wave with the electric field perpendicular to the same arbitrary x-axis. In such a gain element, the direction of the electric field along which the gain is larger is referred to as the preferred-polarization axis of the gain element. A linearly polarized beam with the electric field perpendicular to the preferred-polarization axis of the gain element may experience orders of magnitude lower gain than a linearly polarized beam with the electric field parallel to the gain element's preferred-polarization axis. If the polarization state of the incoming singlemode beam fluctuates in time, as it generally does due to temperature changes, vibration, and scattering of the beam within optical fibers, the gain experienced by the beam incident on the gain element also fluctuates. Generally, this type of fluctuation in polarization produces unacceptable deterioration in the efficiency of the optical system. For this reason, several approaches have been explored in the industry to deal with this sensitivity to polarization orientation of the incoming beam: (a) using a polarization tracking and control system, (b) polarization maintaining (PM) fibers, (c) polarization diversity (making the receiver polarization insensitive), and (d) depolarization of the input beam. These approaches are described, for example, in textbooks on optical communications, such as, L. Kazovsky: Optical Fiber Communication Systems. In the present application, all of these approaches have disadvantages. Polarization tracking systems are complex and expensive systems, polarization maintaining fibers require that the polarization of the input beam is known, i.e. the entire optical link has to be made of the same PM fiber which is not practical due to the high cost of the PM fiber and need to utilize the already existing installed fiber base. Making the receiver or gain element polarization insensitive increases the complexity and the cost of the receiver. Depolarization makes the incoming beam assume a random polarization state (linearly, elliptically, or circularly polarized) in such way that one half of the power in the incoming beam is detected, while the other half is lost. More importantly, present-day depolarizers require a known polarization state at their input to produce a depolarized beam. For example, depolarizers are used to convert the linearly polarized beam from a laser into a randomly or circularly polarized beam.

In a colorless fiber-optic system, due to the passage of the beam through the AWG, connectors, and the length of fiber, the beam assumes an arbitrary polarization upon its return to the gain element. The arbitrary polarization fluctuates and would produce unacceptable variation in the gain at the gain element if the polarization were not somehow controlled. In one embodiment, the beam in the link is depolarized using a depolarizer according to the present invention. As the beam in the link is depolarized, it will result in a 3 dB loss upon coupling back into the gain element. However, the gain will be stable as any appearance of linearly polarized light will be limited and converted to depolarized light.

This application discloses two possible depolarizer types. In one embodiment, the depolarizer is implemented using polarization maintaining fibers and in another embodiment the depolarizer is implemented using waveguides disposed on top of a substrate. The latter embodiment also optionally enables integrating the depolarizer with a WDM filter or the array-waveguide grating thereby allowing lower overall manufacturing cost of the system. The embodiment that includes a depolarizer utilizing polarization-maintaining fibers is illustrated with the help of FIG. 20. This embodiment comprises two segments of polarization maintaining fiber 2010 and 2020 and two segments of standard singlemode fiber: the input segment 2011 and the output segment 2021. The input segment 2011 is coupled to the first polarization maintaining fiber 2010 at the cross-section 2012, while the first polarization maintaining fiber 2010 is coupled to the second polarization maintaining fiber segment 2020 at the cross-section 2015. Finally, the second polarization maintaining fiber segment 2020 is coupled to the output singlemode fiber 2021 at the cross-section 2022. Polarization maintaining (PM) fibers are generally realized by building in biaxial strain in the fiber (examples are Panda fiber or Bow-Tie fiber). In order to maintain the polarization while propagating through such a fiber, the electromagnetic wave has to be launched with the electric field parallel or perpendicular to the stress direction of the fiber. The stress direction is perpendicular to the axis of the optical fiber and is defined by the features within the cladding of the fiber that produce the stress and the resulting birefringence. We will refer to the stress direction or axis as the anisotropy relevant axis that defines the orientation of the polarization maintaining fiber in this embodiment. In one embodiment of the present invention, the polarization maintaining fiber segments 2010 and 2020 joined at the surface 2015 have their respective anisotropy axes 2025 and 2026 offset by an angle 2027 that is substantially equal to 45 degrees. In one embodiment, a linearly polarized wave with a coherence length traveling in the direction 2030 enters from the singlemode fiber 2011 into the polarization maintaining fiber 2010 with polarization that makes an arbitrary angle with the anisotropy axis 2025 of the PM fiber 2010. After coupling into the PM fiber 2010, the incoming mode is decomposed into two independently propagating modes, a slow mode and a fast mode. Normally, in a Lyot depolarizer built using PM fiber, the length of the PM fiber would be adjusted to let the phase difference between the fast and the slow modes equal 90 degrees, to create a circularly polarized beam. However, the disadvantage of that design is that it is very wavelength dependent and that it requires known incoming polarization.

In the present invention the first fiber 2010 is longer than the coherence length of the light beam incident on the depolarizer, i.e., length L1 of 2035 is longer than the coherence length of the light beam. This means that at the exit of the first segment 2010 (at the surface 2015) due to very weak mode coupling in standard PM fiber, the two modes no longer have a defined phase relationship. Generally, the beam at the surface 2015 is randomly polarized and passing through the second PM fiber 2020 does not change this, i.e. the beam at the exit surface 2022 is still randomly polarized. There is only one situation in which the beam at the surface 2015 is not randomly polarized, the case when the linear polarization of the incident beam either coincides with the stress direction of the PM fiber 2010 or is perpendicular to it. In this case the beam exiting at surface 2015 is still linearly polarized. When such a linearly polarized beam is incident onto the second PM fiber segment 2020, it is incident at an angle $\Theta$ and as long as $\Theta$ is substantially equal to $\pi/4$, the linearly polarized beam entering the second PM fiber 2020 will exit in direction 2031 as a randomly polarized beam in which the two axes of polarization are approximately equal. The second segment 2020 is also longer than the coherence length of the optical signal, i.e., the length L2 of 2036 is larger than the coherence length of the light incident on the depolarizer.

A preferred depolarizer comprises two PM fiber segments coupled so that their anisotropy axes are offset by an angle that is substantially equal to 45 degrees. In another embodiment, the length of each PM fiber segment is substantially longer than the coherence length of the light beam being depolarized.

The second embodiment of the depolarizer utilizes rectangular waveguides disposed on a substrate as illustrated in FIG. 21. A substrate 2101 is made out of glass or any other material that is rigid and suitable for micromachining using technologies known in the art. Two rectangular waveguides 2110 and 2111 are disposed in a trench 2103 that is made in the top surface 2102 of the substrate 2101. The optical axis of a rectangular waveguide is defined as the direction parallel to the longest dimension of the waveguide. It is also the direction along which a guided electromagnetic wave would propagate. Each of the two rectangular waveguides also have two transverse axes and the dimension of the waveguides along these two transverse axes are different making the two lowest order modes propagate with perpendicular polarizations and distinctly different propagation constants. The two transverse axes in each of the rectangular waveguides are referred to as the slow polarization axis and the fast polarization axis. The two waveguides 2110 and 2111 are joined in such a way that light propagating from the waveguide 2110 efficiently couples to the waveguide 2110 at the joint 2104. The optical axes of the two rectangular waveguides 2110 and 2111 are parallel to one another. The fast polarization axis of the waveguide 2110 is inclined relative to the fast polarization axis of waveguide 2111 at an angle 2127 that is substantially 45 degrees. The length of each of the waveguides 2110 and 2111 is preferably longer than the coherence length of the light propagating through the waveguides.

The principle of operation of the depolarizer 2100 shown in FIG. 21 is as follows: an arbitrarily polarized electromagnetic wave is incident from direction 2106 upon the entrance 2105 into waveguide 2110 and is decomposed into two modes with orthogonal polarizations. The two orthogonally polarized modes propagate along the waveguide 2110 with two different velocities. Due to the loss of coherence, the phases of the two modes become uncorrelated to each other by the time they reach the joint 2104. At this point the two modes couple into the second waveguide 2111, again exciting two orthogonal modes which travel at different velocities toward the end 2107 of the second waveguide 2111. The excitation of the modes in the second waveguide 2111 occurs with the fast polarization axis of the waveguide 2110 inclined to the fast polarization axis of the waveguide 2111 at an angle substantially equal to 45 degrees. At the end 2107 the two waves reconstruct an electromagnetic wave that is randomly polarized, thereby randomly polarizing the arbitrarily polarized wave that was incident on the entrance 2105 to the depolarizer 2100.

In one embodiment, the waveguides 2110 and 2111 have triangular cross-sections, while in another embodiment the cross-section of the waveguides 2110 and 2111 is trapezoidal. It should be clear that the rectangular waveguide shape in the above-described embodiment is used as an example and that any other waveguide shape that can be realized on top of a substrate and that supports two modes with orthogonal polarizations and different propagation constants can be used to accomplish the same function. In some embodiments, the angle between the fast polarization axes of the two waveguides may not be exactly 45 degrees, because some amount of depolarization can be accomplished with any angle that is different from both zero and 90 degrees.

Figure 1:
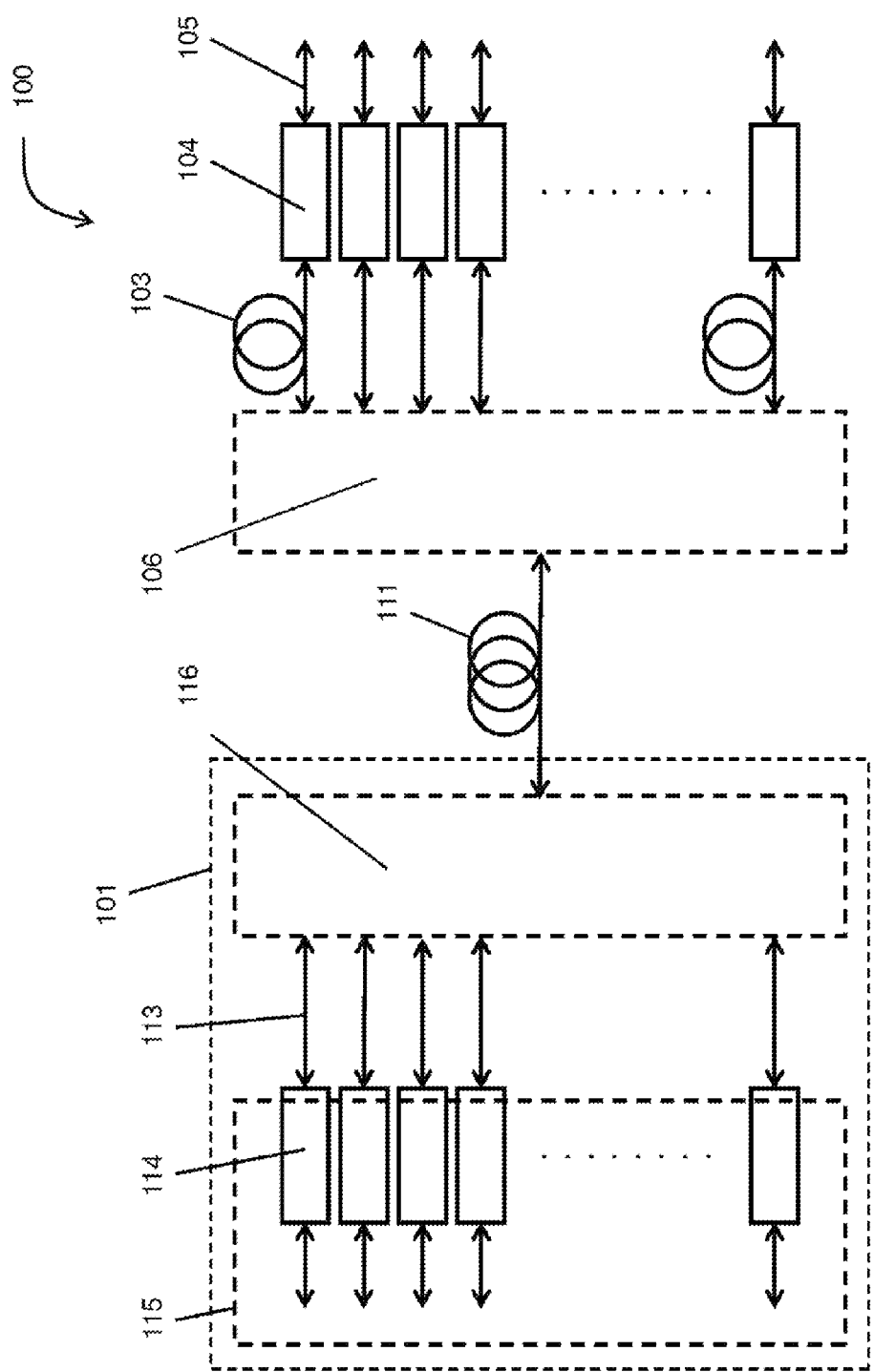
FIG. 1. Schematic view of an improved colorless optical network.
Figure 2:
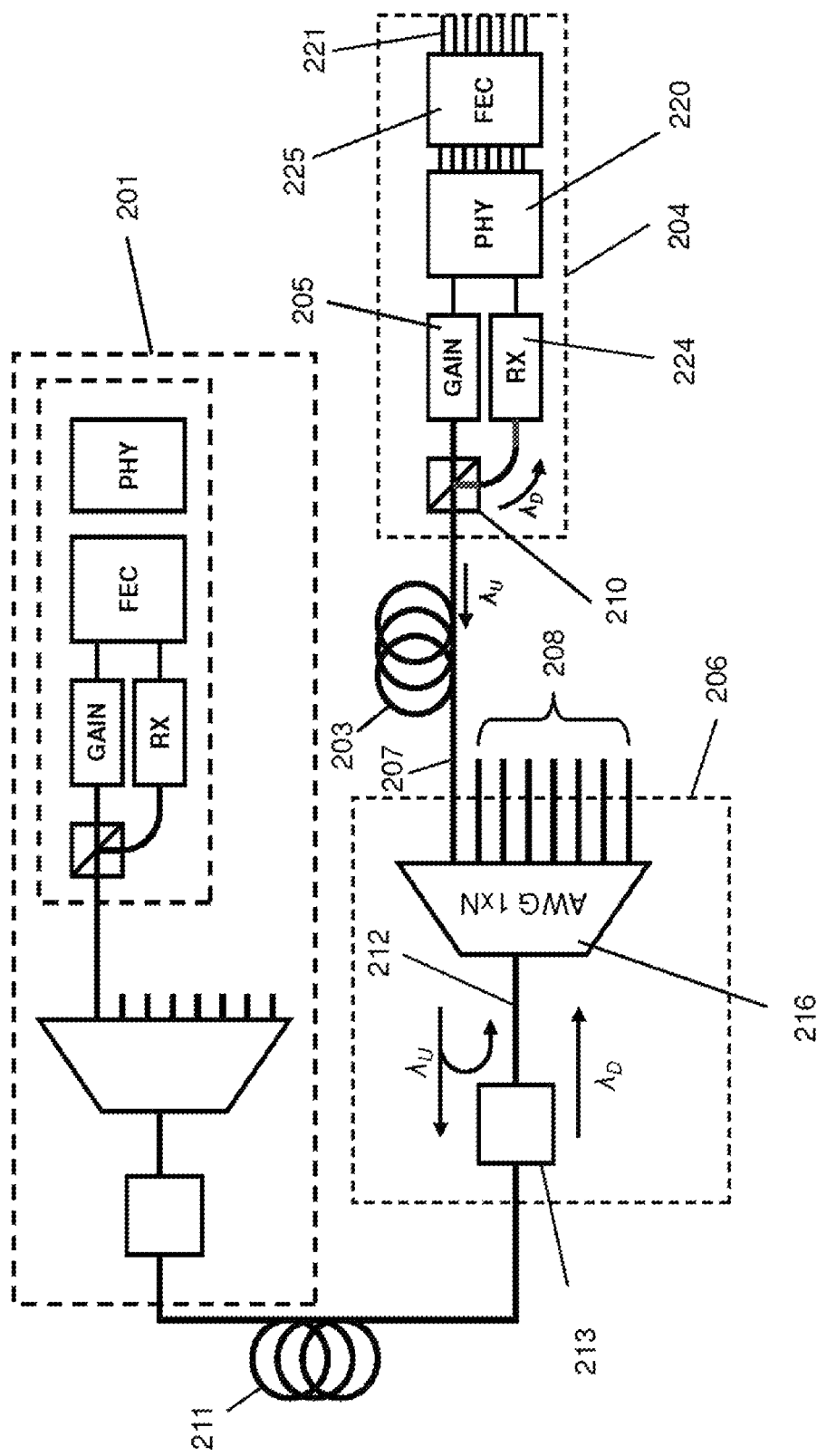
FIG. 2. Schematic view of the improved colorless optical network of FIG. 1 showing possible elements in the remote node and individual optical network units.
Figure 3:
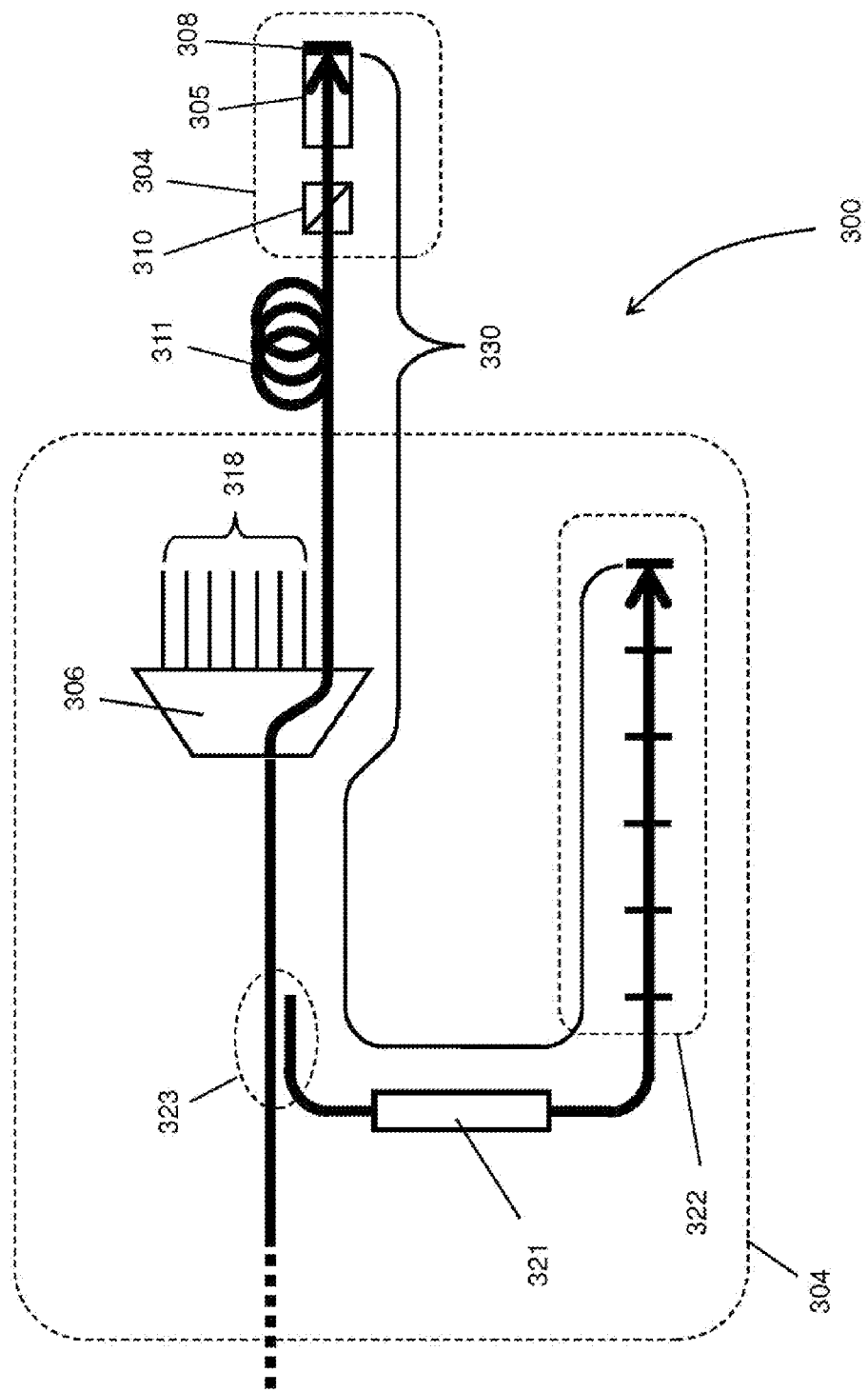
FIG. 3. Exemplary architecture of the upstream optical signal generation and modulation.
Figure 4:
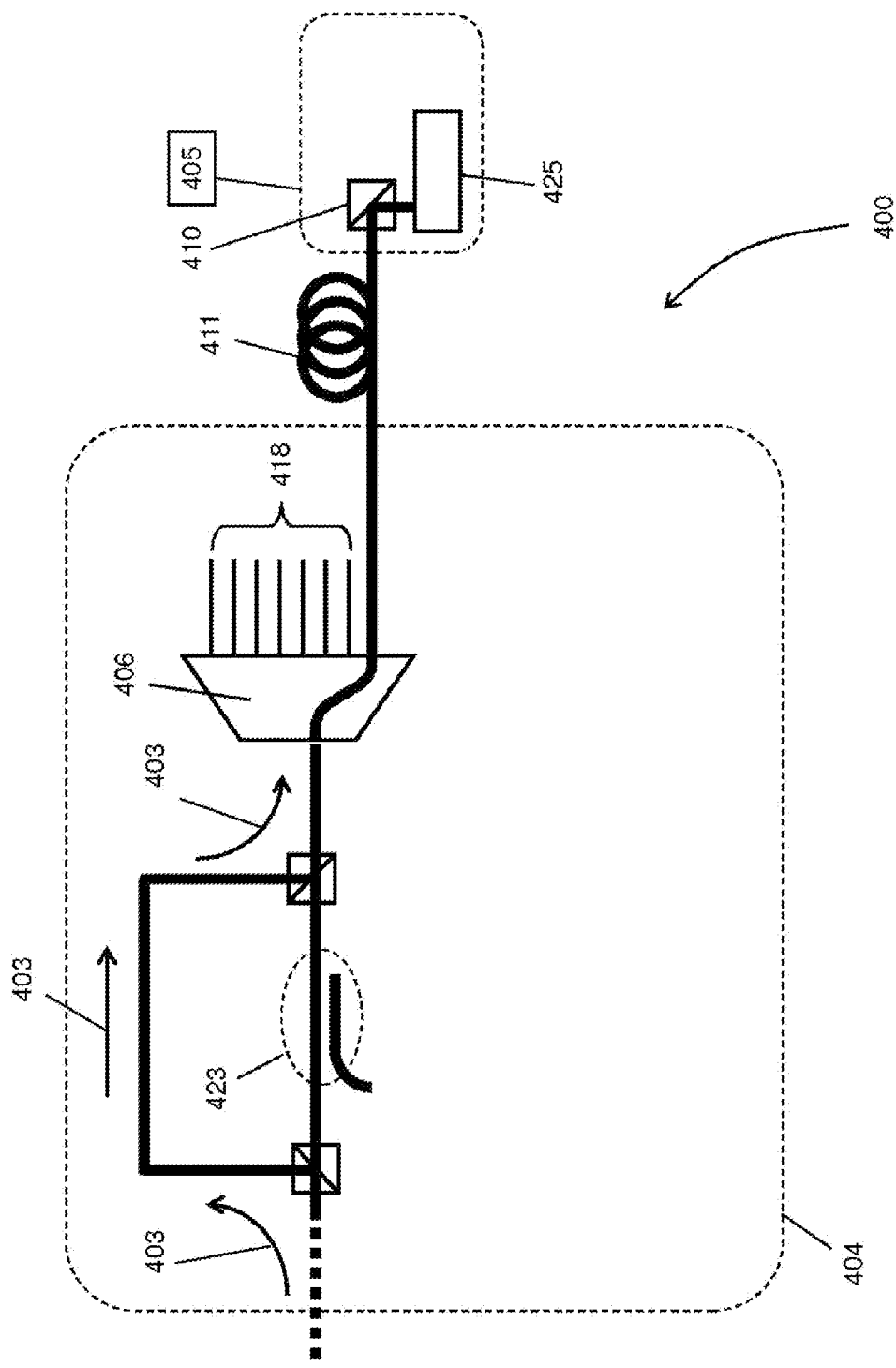
FIG. 4. Exemplary architecture for the downstream optical signal detection.
Figure 5:
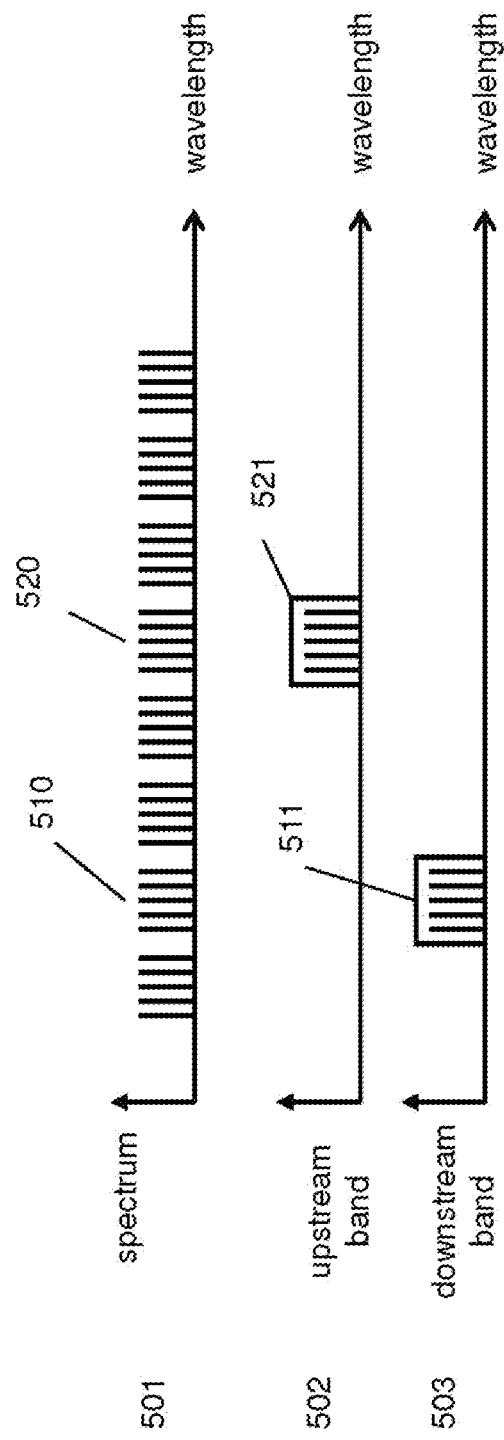
FIG. 5. Illustration of the available communication spectrum and the use of upstream and downstream wavelengths.
Figure 6:
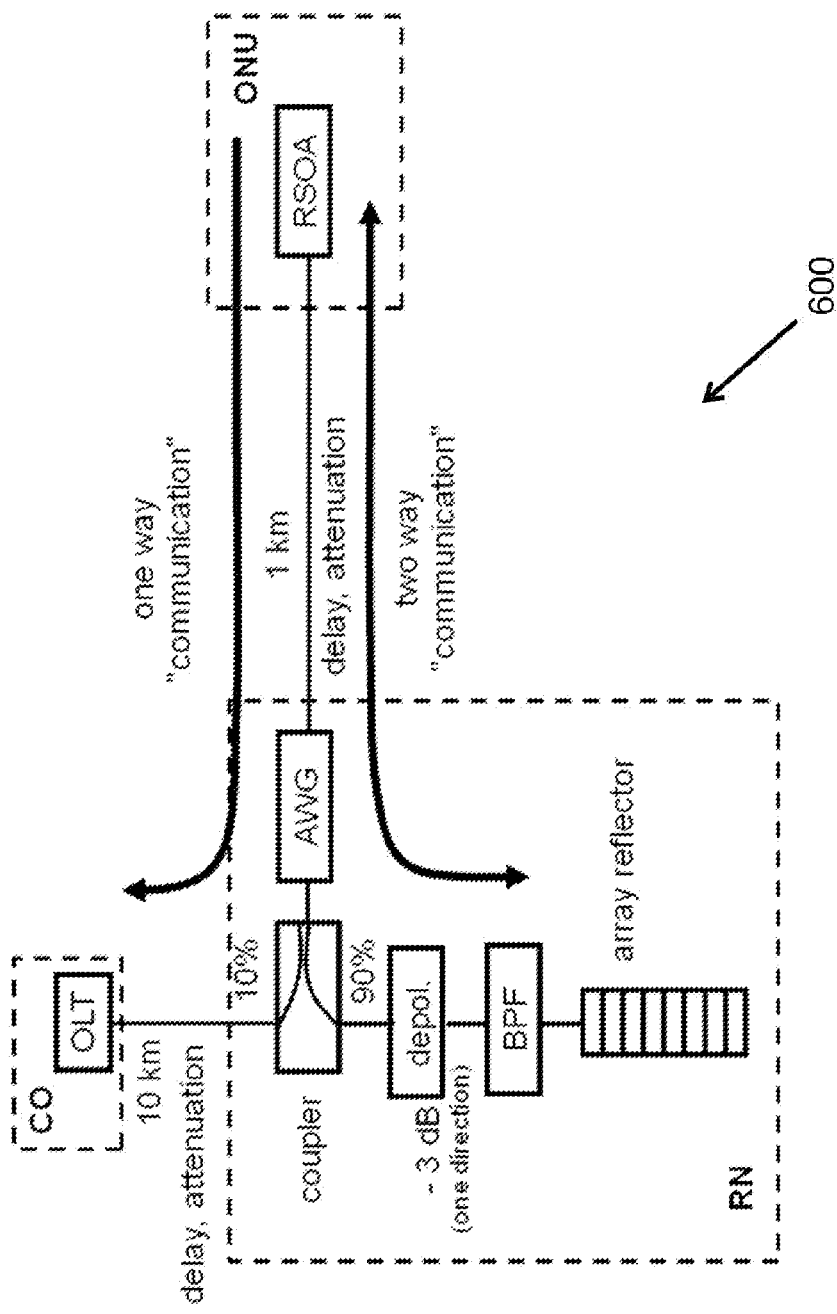
FIG. 6. Exemplary view of an embodiment of the upstream optical signal generation.
Figure 7:
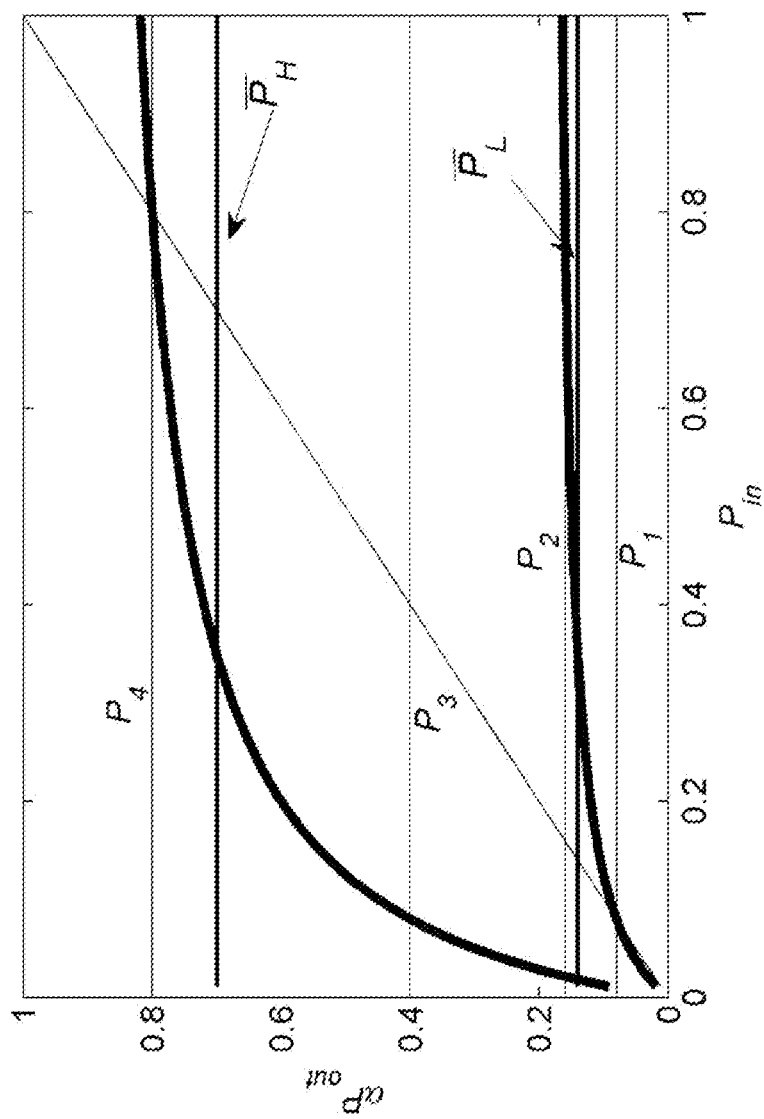
FIG. 7. Illustration of the input and output characteristic of the saturated amplifier in the link.
Figure 8:
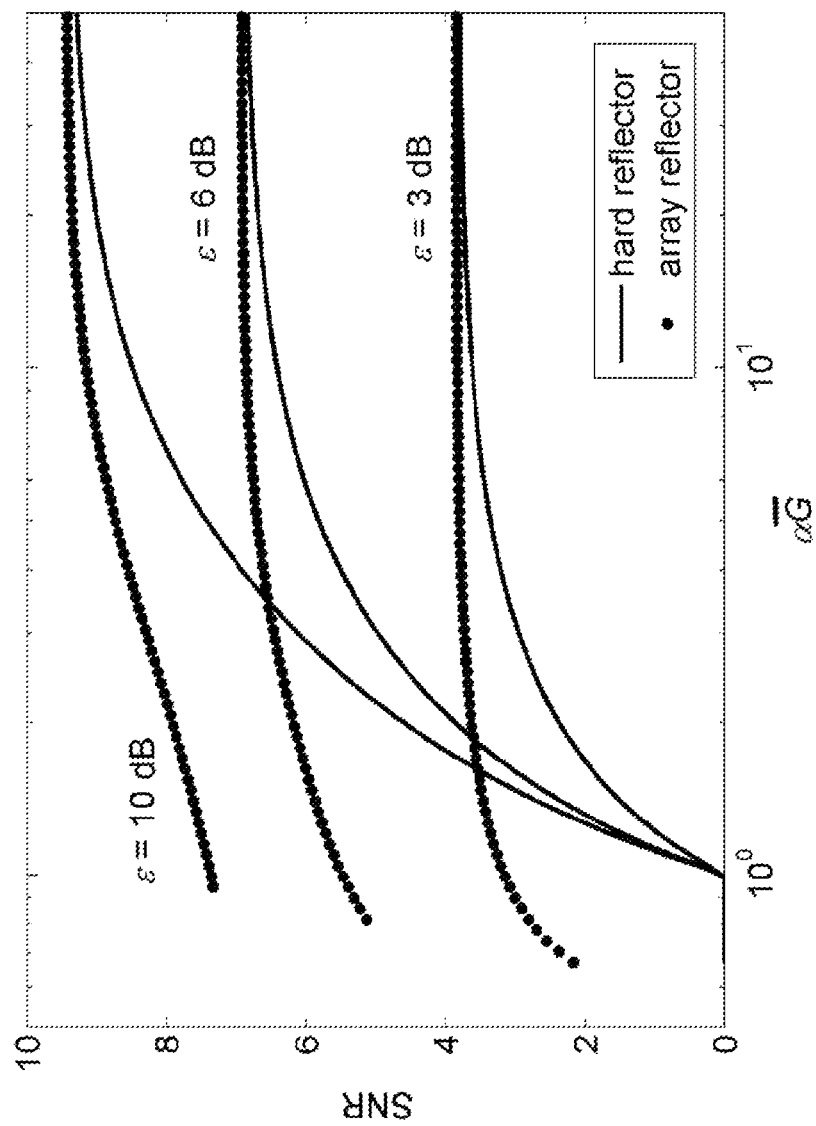
FIG. 8 Signal-to-noise ratio for hard and array reflector versus round trip gain and extinction ratio ($\epsilon$) show improvement when using the array reflector. This figure uses $\gamma=0.05$. $BW_o=0.4$ nm, and $BW_e=750$ MHz.
Figure 9:
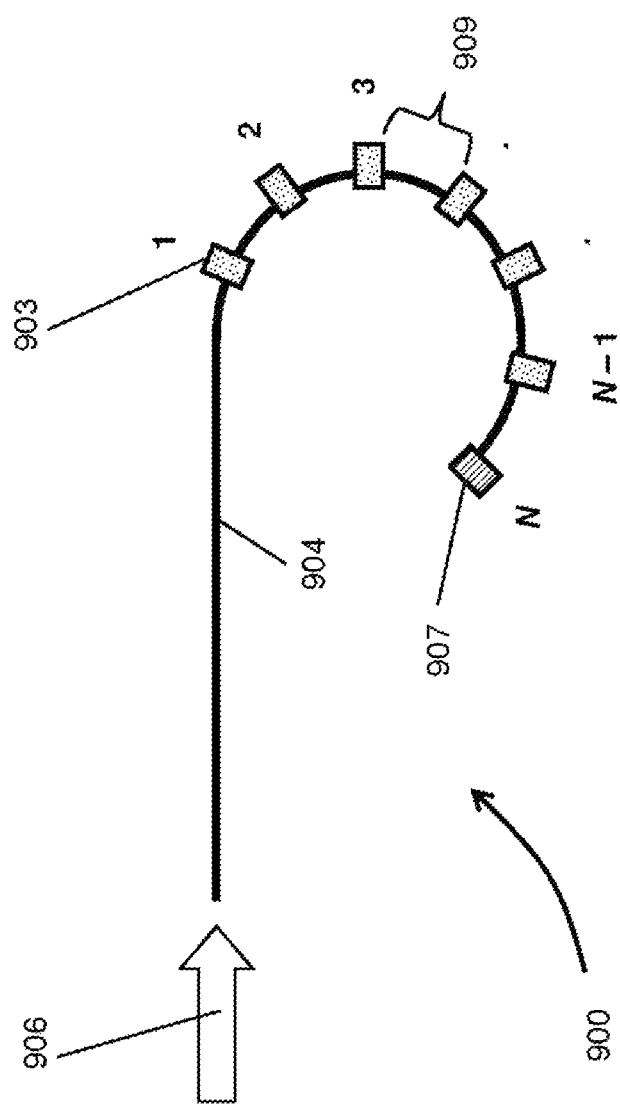
FIG. 9. Array reflector with N in-fiber mirrors terminated with high reflectivity mirror; all other mirrors are semi-transparent.
Figure 10:
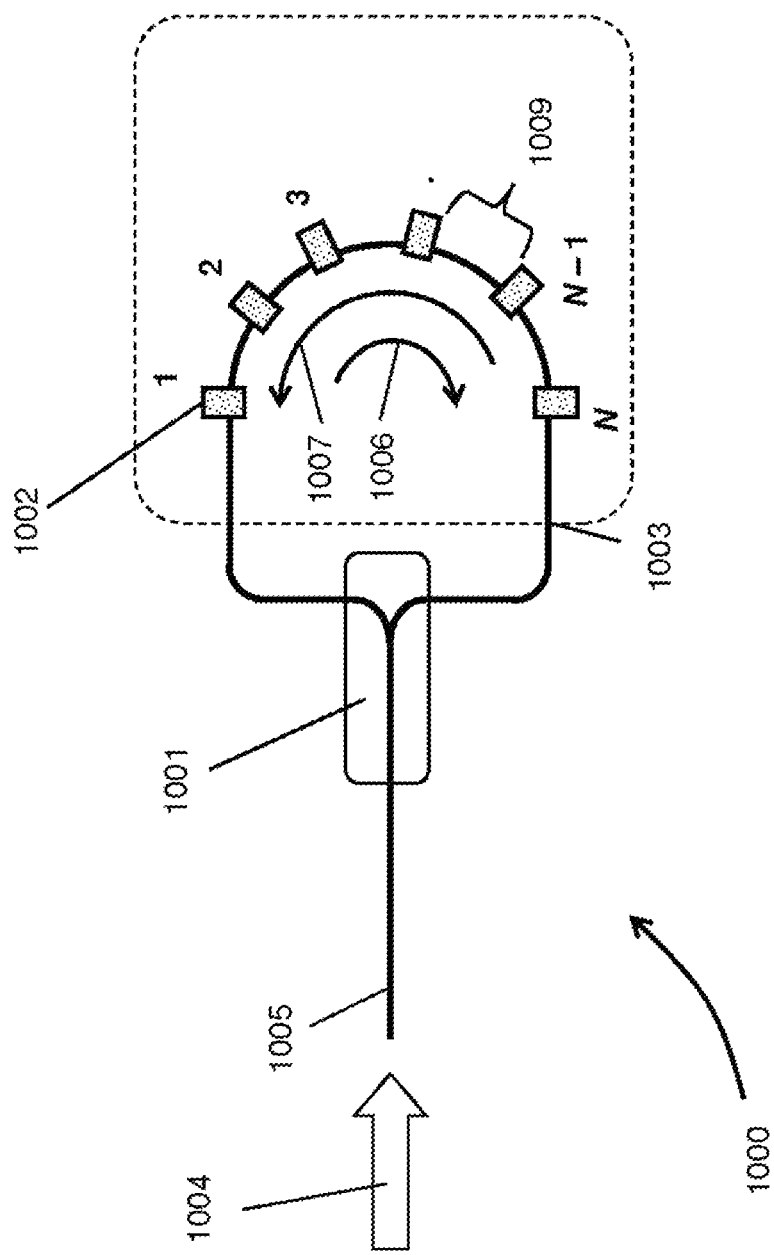
FIG. 10. Array reflector with N in-fiber mirrors in a loop; all in-fiber mirrors are semi-transparent.
Figure 11:
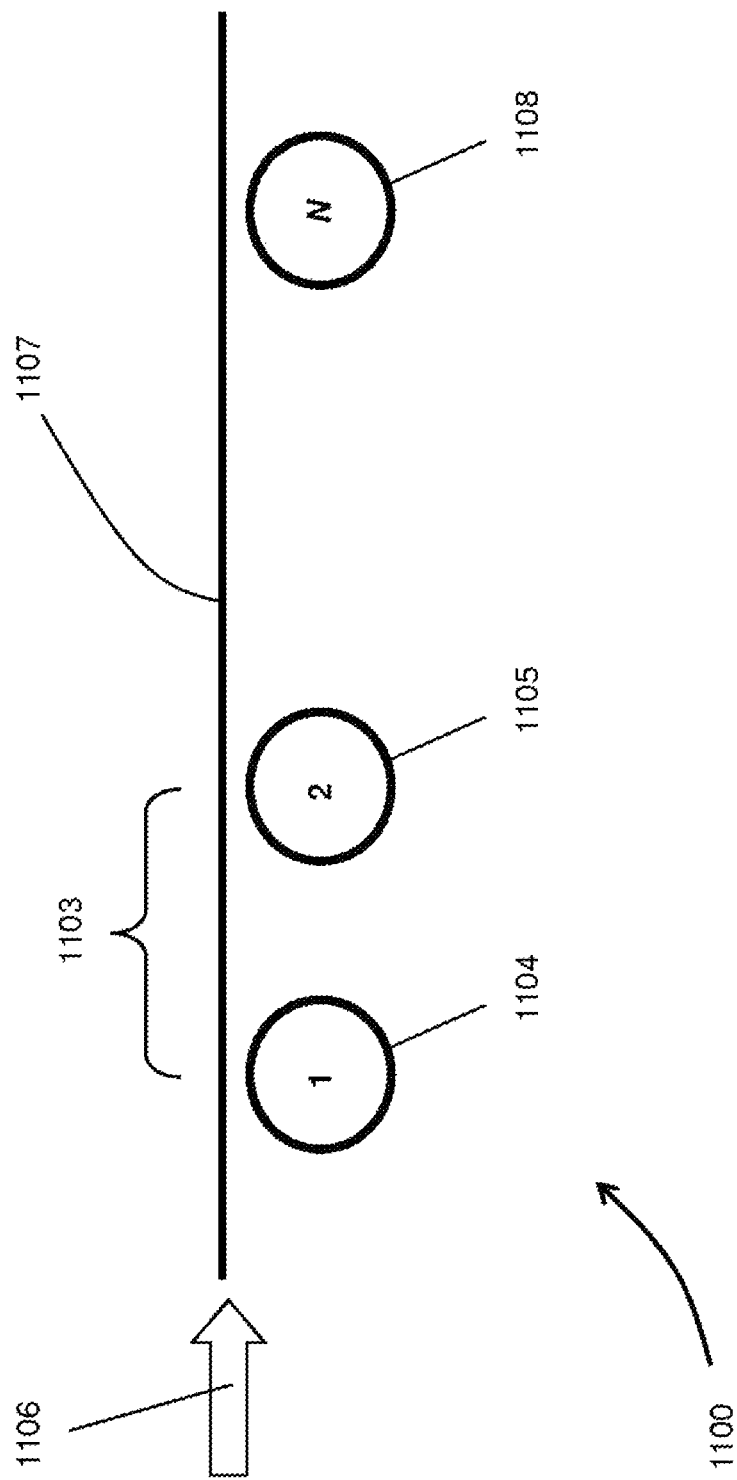
FIG. 11. Array-reflector with N ring-oscillator filters.
Figure 12:
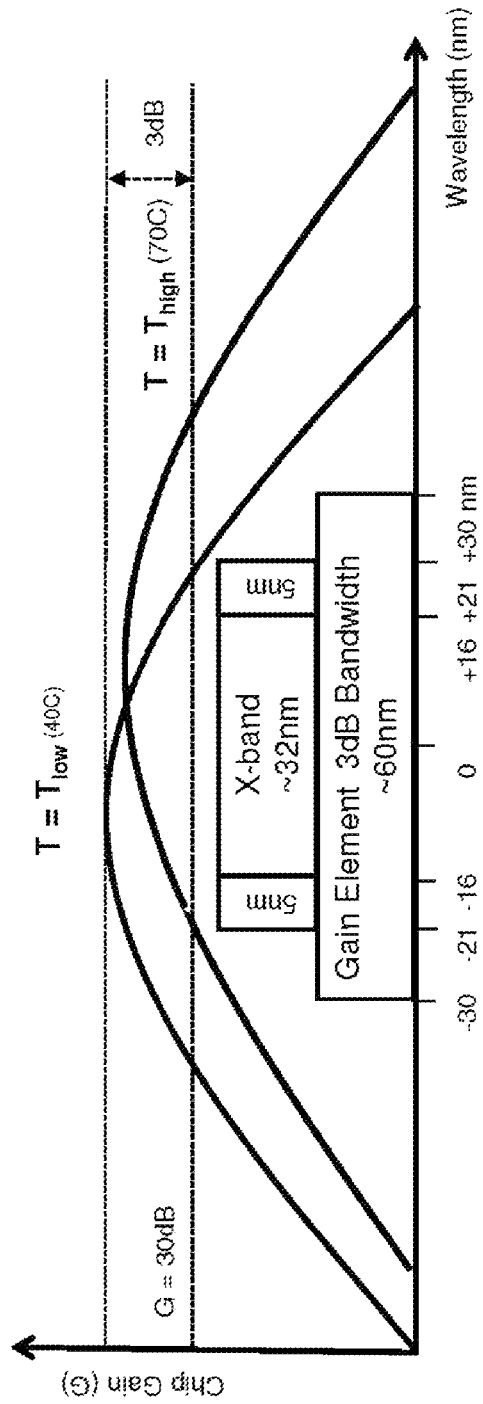
FIG. 12. Illustration showing how temperature compensation can be used to widen the wavelength operating range of a semiconductor optical amplifier.
Figure 13:
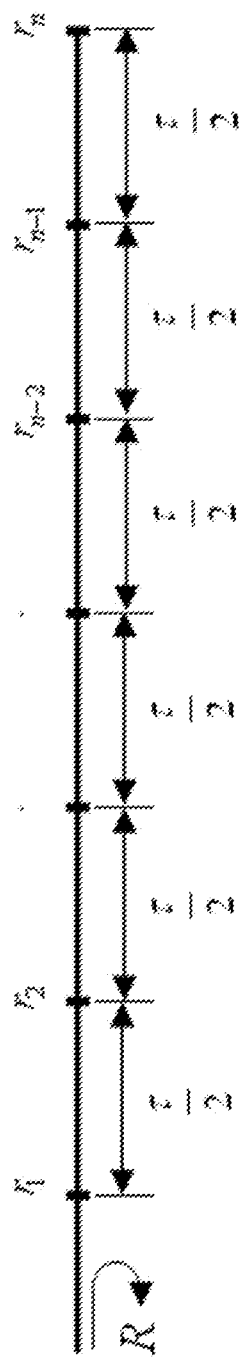
FIG. 13. Array reflector illustration for the model: end reflector has unit reflectivity; all other mirrors are semi-transparent, $r_i<1$, for $i=1:n-1$.
Figure 14:
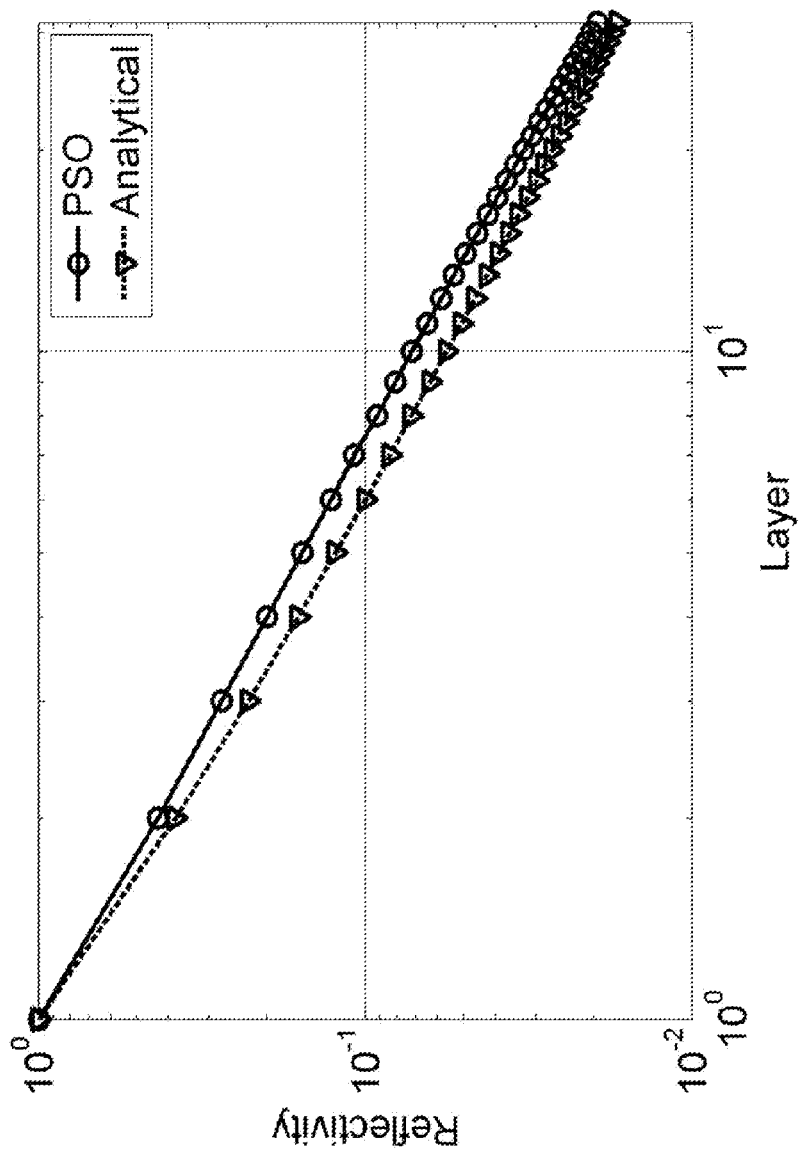
FIG. 14. Comparison between PSO and analytically obtained ideal reflectivity for the 31-layer progressive reflectivity array reflector (PAR).
Figure 15:
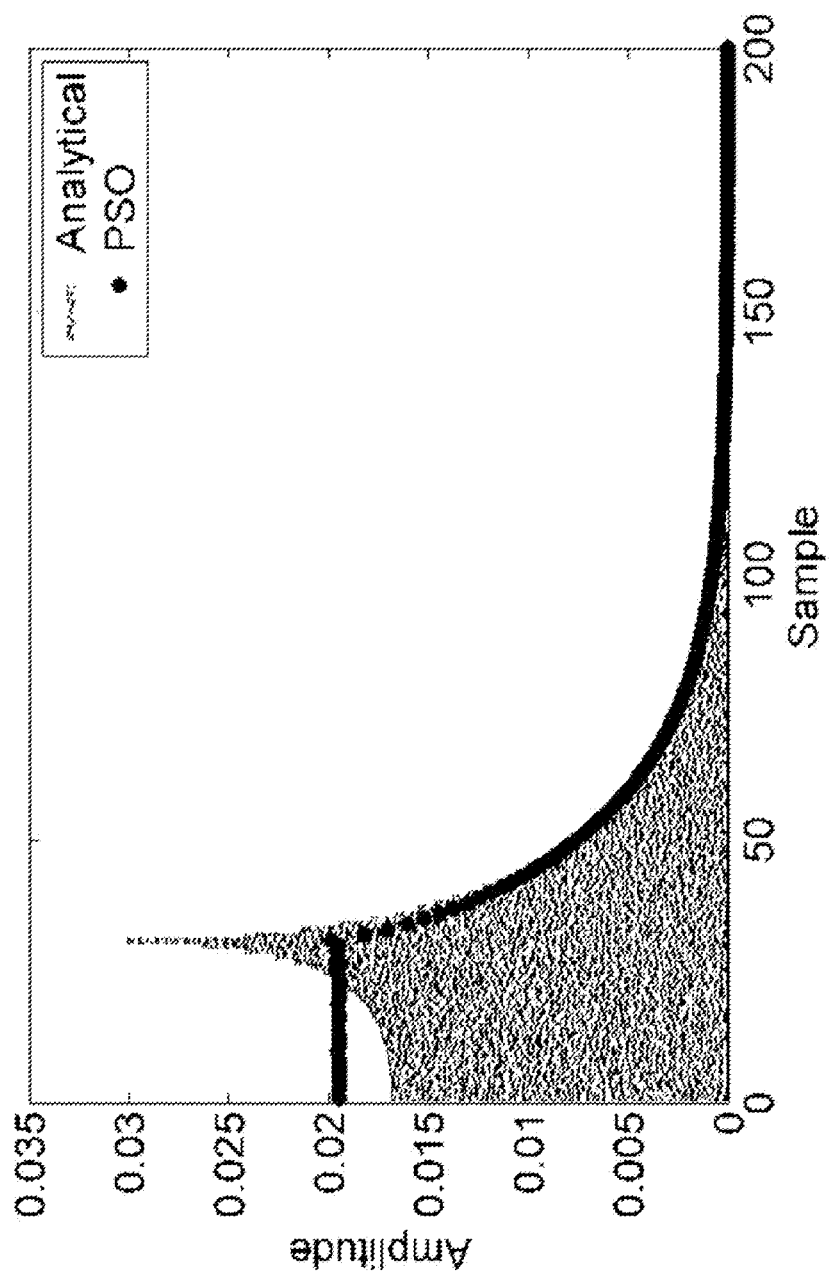
FIG. 15. Comparison of the impulse response of the analytically derived and PSO optimized 31-layer PAR. The neglecting of multiple reflections leads to non-monotonic response, but energy spread is still substantial.
Figure 16:
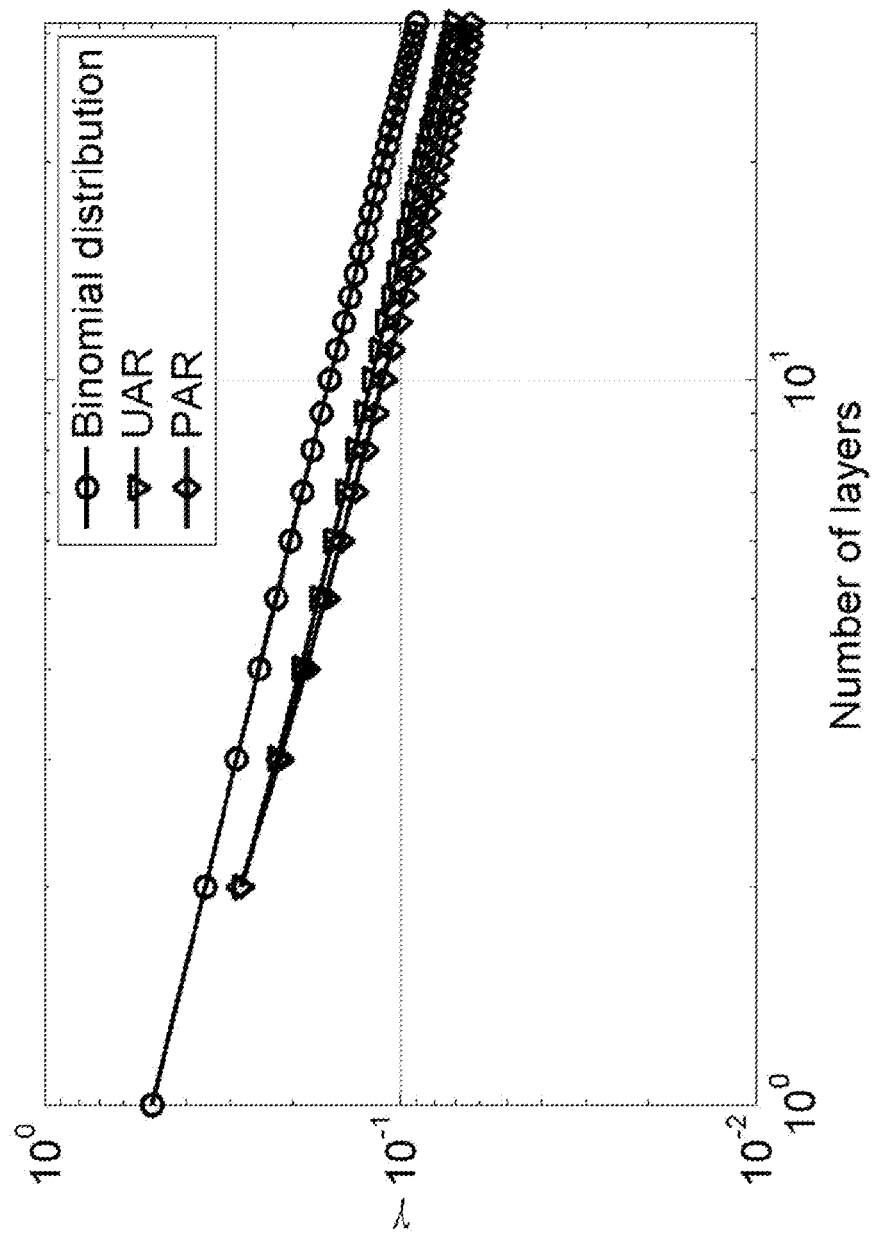
FIG. 16. Comparison between uniform and progressive reflectivity reflectors with different number of layers. The numerically obtained results are also compared to analytically calculated values for binominal distribution (hypothetical FIR reflector with impulse response having n equal impulses)
Figure 17:
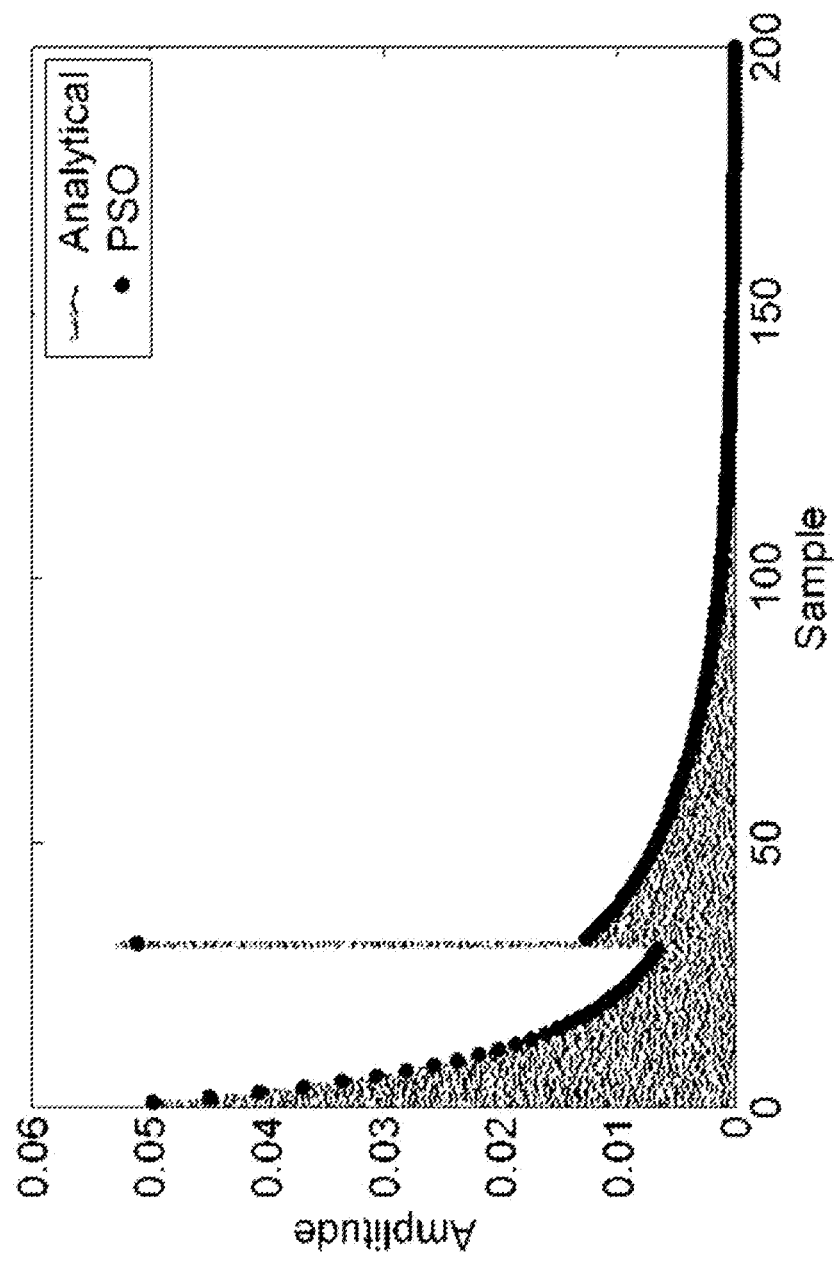
FIG. 17. Comparison between analytically derived and PSO optimized 31-layer uniform reflectivity array reflector (UAR) impulse response.
Figure 18:
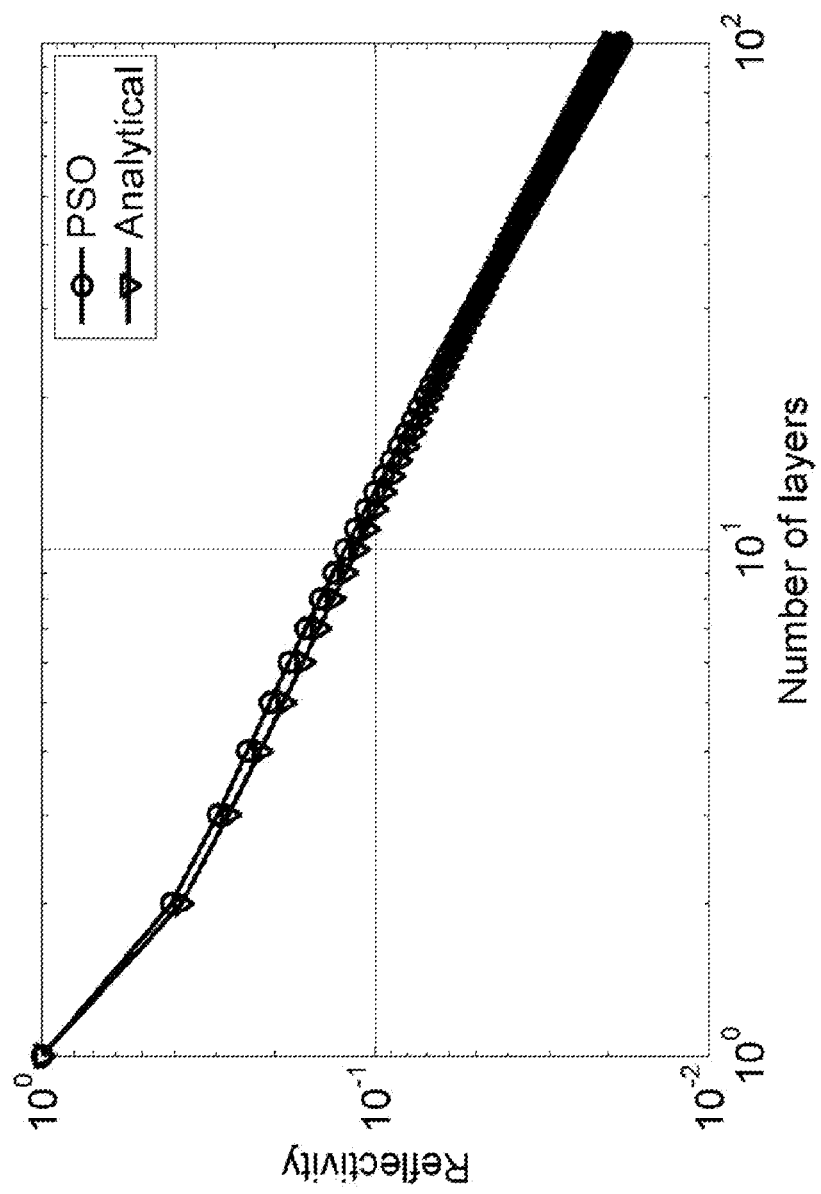
FIG. 18. Comparison between PSO and analytically obtained ideal reflectivity for the reflector with n equally reflective mirrors (UAR).
Figure 19:
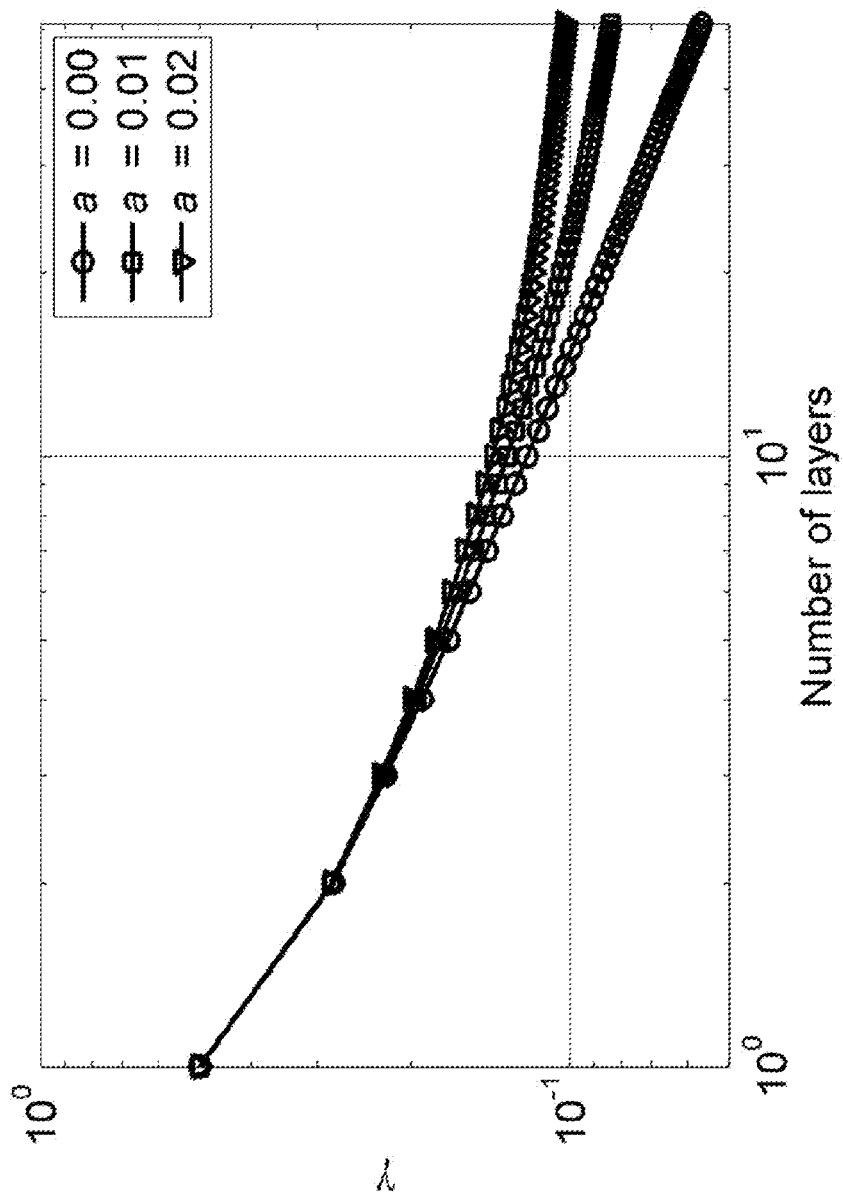
FIG. 19. The effect of losses on $\gamma$ for UAR case. The losses are determined by parameter a (see eqn. 14).
Figure 20:
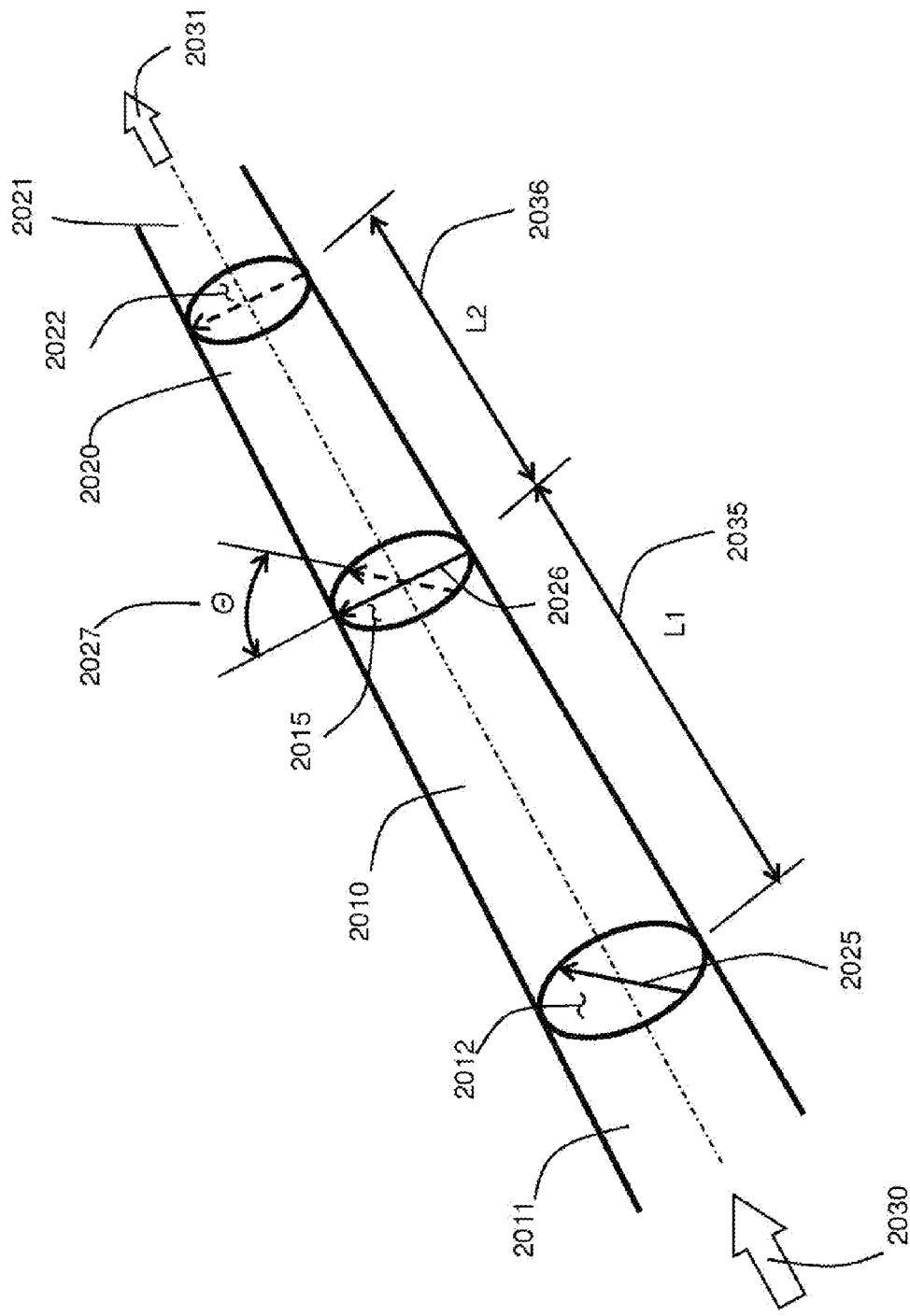
FIG. 20: An illustration of a preferred embodiment of a fiber depolarizer.
Figure 21:
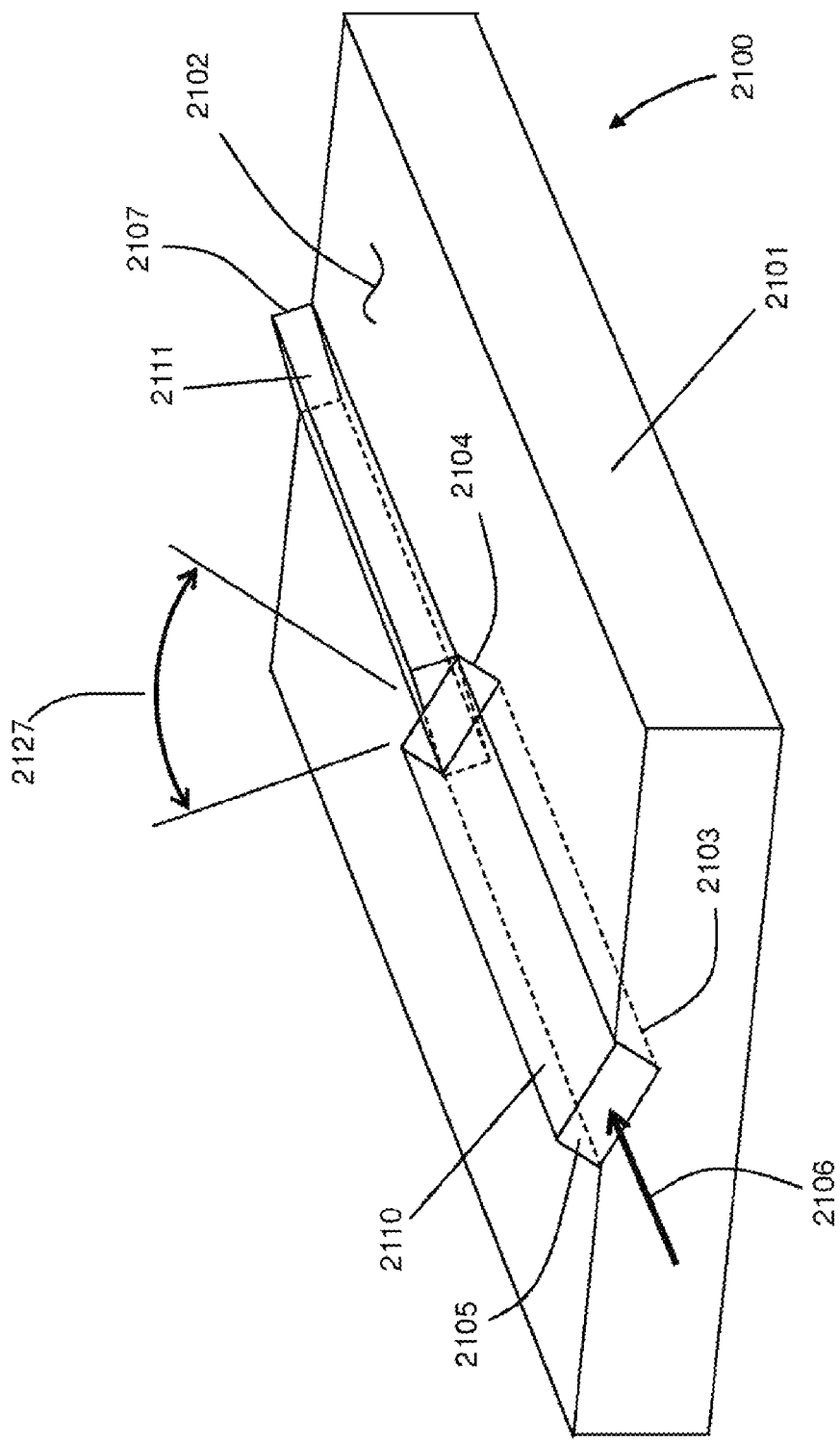
FIG. 21. An illustration of a preferred embodiment of a waveguide depolarizer.

The invention claimed is:

1. An array reflector configured for operation with amplitude modulation at a line rate, the array reflector comprising:
    a waveguide having an input end and a reflective end;
    a high reflectivity mirror disposed at said reflective end; and
    n−1 mirrors arrayed along the length of said waveguide;
    wherein n is an integer greater than three; and
    wherein a product of said line rate and the round trip optical delay between any pair of adjacent mirrors is substantially equal to unity.

2. The array reflector of claim 1 further characterized by an impulse response for an optical signal incident on said input end, said impulse response comprising a sequence of pulses, wherein no pulse has an amplitude greater than $1/\sqrt{k}$ when said impulse response is normalized to unity, and wherein k is the ordinal number of said pulses starting from one.

3. The array reflector of claim 1, wherein said waveguide is an optical fiber.

4. The array reflector of claim 3, wherein all of said n−1 mirrors have substantially equal optical power reflectivity.

5. The array reflector of claim 3, wherein each of said n−1 mirrors is a fiber Bragg grating.

6. The array reflector of claim 3, wherein said high-reflectivity mirror at said reflective end includes an optical interference coating.

7. The array reflector of claim 6, wherein said high reflectivity mirror exhibits optical power reflectivity greater than 90%.

8. The array reflector of claim 3, wherein each of said n−1 mirrors is further characterized as having an absorptance less than 1%.

9. The array reflector of claim 3, wherein each of said n−1 mirrors is further characterized as having an absorptance less than 0.1%.

10. The array reflector of claim 6, wherein said reflective end is a cleaved fiber end.

11. The array reflector of claim 1, wherein the optical power reflectivity value of each of said n−1 mirrors is a decreasing function of the ordinal mirror number counting from said reflective end.

12. The array reflector of claim 11, wherein said waveguide is an optical fiber.

13. The array reflector of claim 12, wherein said high-reflectivity mirror at said reflective end includes an optical interference coating.

14. The array reflector of claim 12, wherein each of said n−1 mirrors is further characterized as having an absorptance less than 1%.

15. The array reflector of claim 14, wherein each of said n−1 mirrors is further characterized as having an absorptance less than 0.1%.

* * * * *